(12) United States Patent
Chen

(10) Patent No.: US 11,048,837 B2
(45) Date of Patent: Jun. 29, 2021

(54) GENERATION OF DYNAMIC DESIGN FLOWS FOR INTEGRATED CIRCUITS

(71) Applicant: SiFive, Inc., San Mateo, CA (US)

(72) Inventor: Han Chen, Cupertino, CA (US)

(73) Assignee: SiFive, Inc., San Mateo, CA (US)

( * ) Notice: Subject to any disclaimer, the term of this patent is extended or adjusted under 35 U.S.C. 154(b) by 0 days.

(21) Appl. No.: 16/527,713

(22) Filed: Jul. 31, 2019

(65) Prior Publication Data

US 2020/0349236 A1 Nov. 5, 2020

Related U.S. Application Data

(60) Provisional application No. 62/842,438, filed on May 2, 2019.

(51) Int. Cl.
 *G06F 30/20* (2020.01)
 *G06F 30/30* (2020.01)

(52) U.S. Cl.
 CPC .............. *G06F 30/20* (2020.01); *G06F 30/30* (2020.01)

(58) Field of Classification Search
 CPC ........................................................ G06F 30/20
 USPC .......................................................... 716/132
 See application file for complete search history.

(56) References Cited

U.S. PATENT DOCUMENTS

2002/0144212 A1* 10/2002 Lev .......................... G06F 30/30
716/102

OTHER PUBLICATIONS

H. Cook et al.; Diplomatic Design Patterns: A TileLink Case Study; CARRV 17; Oct. 2017; Boston, MA; 7 pages.
E. Cote; Edmond Cote's Blog: Gentle introduction to diplomacy; May 3, 2017; 3 pages. blog.edmondcote.com/2017/05/gentle-introduction-to-diplomacy.html.
P. S. Li et al.; Specification for the FIRRTL Language; Electrical Engineering and Computer Sciences, University of California at Berkeley; Feb. 24, 2016; 57 pages.
K. Asanovic et al.; The Rocket Chip Generator; Electrical Engineering and Computer Sciences, University of California at Berkeley; Apr. 15, 2016; 11 pages.

(Continued)

*Primary Examiner* — Eric D Lee
(74) *Attorney, Agent, or Firm* — Young Basile Hanlon & MacFarlane, P.C.

(57) ABSTRACT

Systems and methods are disclosed for to generation of dynamic design flows for integrated circuits. For example, a method may include accessing a design flow configuration data structure, wherein the design flow configuration data structure is encoded in a tool control language; based on the design flow configuration data structure, selecting multiple flowmodules from a set of flowmodules, wherein each flowmodule provides an application programming interface, in the tool control language, to a respective electronic design automation tool; based on the design flow configuration data structure, generating a design flow as a directed acyclic graph including the selected flowmodules as vertices; and generating an output integrated circuit design data structure, based on one or more input integrated circuit design data structures, using the design flow to control the respective electronic design automation tools of the selected flowmodules.

27 Claims, 17 Drawing Sheets

(56) References Cited

OTHER PUBLICATIONS

A. Izraelevitz et al.; Reusability is FIRRTL Ground: Hardware Construction Languages, Compiler Frameworks, and Transformations; Department of Electrical Engineering and Computer Sciences, University of California at Berkeley; 8 pages.

Y. Lee; Free Chips Project: a nonprofit for hosting open-source RISC-V implementations, tools, code; 2016; 25 pages.

Xilinx, Vivado Design Suite User Guide, Designing IP Subsystems Using IP Integrator; UG994 (v2017.1); Apr. 5, 2017; 203 pages.

J. Ellson et al.; Graphviz and Dynagraph—Static and Dynamic Graph Drawing Tools; AT&T Labs—Research, Florham Park NJ; 2003; 23 pages.

C. Chao; Digital IC Design Flow; Graduate Institute of Electronics Engineering, NTU; Mar. 8, 2006; (available at http://access.ee.ntu.edu.tw/course/under_project_94/pdf/20060308_ic_design_flow.pdf); 47 pages.

A. Fatima; Introducing the Integrated Circuit (IC) Design Cycle; EEWeb; Sep. 11, 2018; (available at https://www.eeweb.com/profile/aijazfatima20/articles/introducing-the-integrated-circuit-ic-design-cycle); 23 pages.

Graphviz; Graphviz—Graph Visualization Software; (accessed on Apr. 17, 2020); (available at https://www.graphviz.org); 4 pages.

Wikipedia, Integrated Circuit Design; (accessed on Apr. 17, 2020); (available at https://en.wikipedia.org/wiki/Integrated_circuit_design); 8 pages.

TCL Developer Xchage; Uses for Tcl/Tk; (accessed on Apr. 17, 2020); (available at https://http://www.tcl-lang.org/about/uses.html); 2 pages.

International Search Report and Written Opinion for International Application No. PCT/US2020/031001 dated Aug. 25, 2020.

Wang, et al.; "Hammer: Enabling Reusable Physical Design"; Proceedings of the Workshop on Open-Source EDA Technology, Nov. 8, 2018; https://woset-workshop.github.io/WOSET.

A. Mametjanov, et al.; "Autotuning FPGA design parameters for performance and power"; Proceedings of the IEEE 23rd Annual International Symposium on Field-Programmable Custom Computing Machines, May 2, 2015, pp. 84-91.

D. Kim, et al.; "Debugging RISC-V Processors with FPGA-Accelerated RTL Simulation in the FPGA Cloud"; Proceedings of the 2nd Workshop on Computer Architecture Research with RISC-V, Jun. 2, 2018, pp. 1-7; https://carrv.github.io/2018/.

"Physical design (electronics)"; Wikipedia, Mar. 28, 2019, 7 pages; https://en.wikipedia.org/w/index.php?title=Physical_design_(electronics)&oldid=889842923 (retrieved on Nov. 8, 2020).

"Doxygen"; Wikipedia, Apr. 11, 2019, 5 pages; https://en.wikipedia.org/w/index.php?title=Doxygen&oldid=891955414 (retrieved on Aug. 11, 2020).

S. Bailey, et al.; "A 28nm FDSOI 8192-point digital ASIC spectrometer from a Chisel generator"; Proceedings of the IEEE Custom Integrated Circuits Conference, Apr. 8, 2018, pp. 1-4.

* cited by examiner

GENERATION OF DYNAMIC DESIGN FLOWS FOR INTEGRATED CIRCUITS

CROSS-REFERENCE TO RELATED APPLICATION(S)

This application claims the benefit of U.S. Provisional Application No. 62/842,438, filed May 2, 2019, which is incorporated herein by reference in its entirety.

TECHNICAL FIELD

This disclosure relates to generation of dynamic design flows for integrated circuits.

BACKGROUND

Integrated circuits are typically designed and tested in a multi-step process that involves multiple specialized engineers performing a variety of different design and verification tasks on an integrated circuit design. A variety of internal or proprietary (e.g. company-specific) integrated circuit design tool chains are typically used by these engineers to handle different parts of the integrated circuit design workflow of using commercial electronic design automation (EDA) tools.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

DETAILED DESCRIPTION

Figure 1:
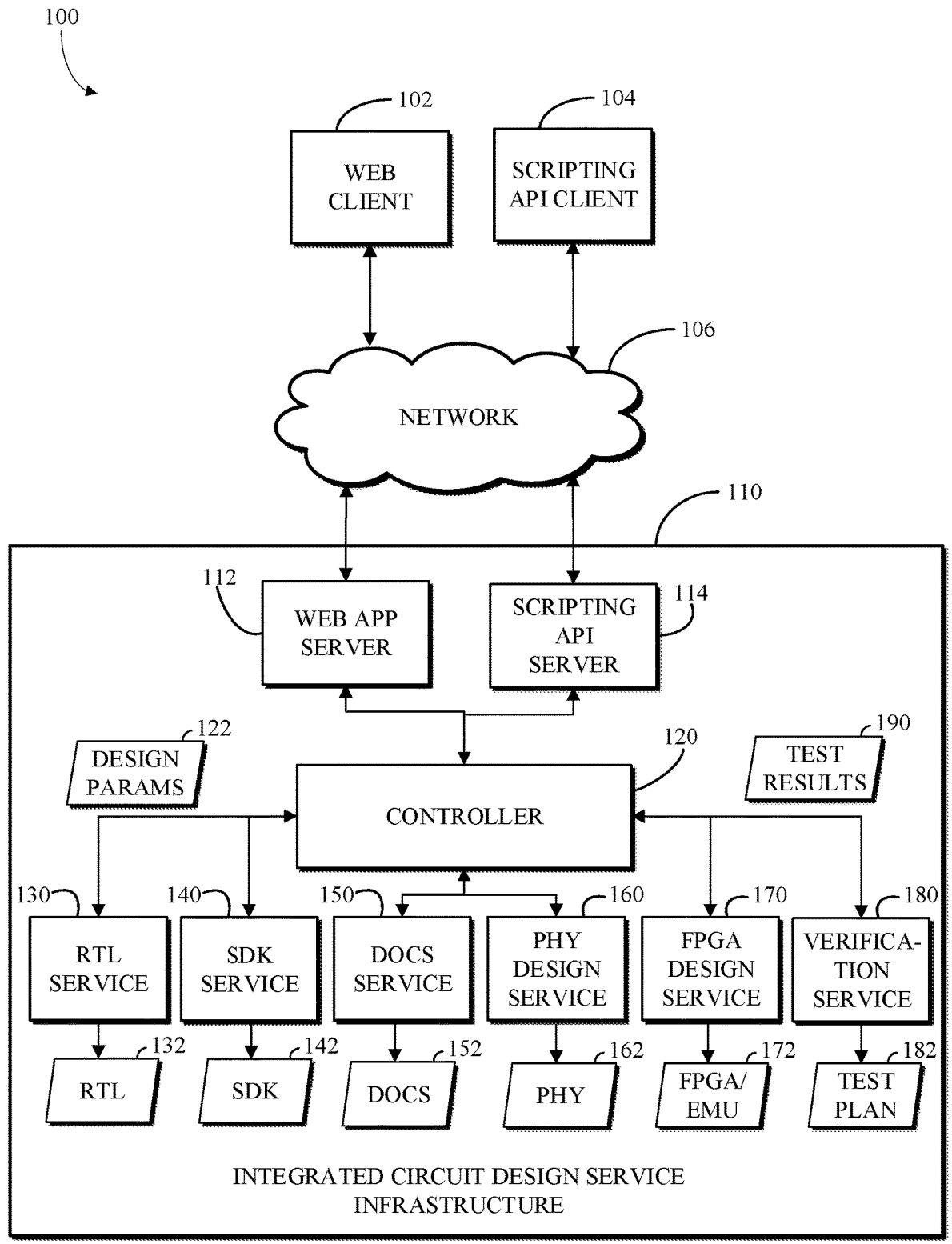
FIG. 1 is block diagram of an example of a system for facilitating design of integrated circuits.

Systems and methods for automated generation and testing of integrated circuit designs are disclosed. These systems provide a method that allows a single engineer who has an idea for a processor, or system on a chip (SoC), design to easily specify their chip requirements in terms of a handful of design parameter values (or colloquially knobs) and have the system automate the operation of many commercial electronic design automation (EDA) tools for both design and verification of the processors, or SoC, and thus accomplish with a single engineer in hours (or minutes) what traditionally has taken massive teams of specialized engineers familiar with the operation of specific EDA tools a much longer period of time.

Thus, the system and methods enable the following challenging technical problems to be addressed: (a) allow the design of processors and SoCs by a single, non-expert who understands high-level requirements, (b) easily allow the scripted exploration of the design-space through the generation of potentially thousands of alternate expressions of the requirements and simulation, or emulation, of the completed designs en masse, (c) automate the integration of intellectual property (IP) cores (or blocks) from multiple third parties with a processor design into an SoC, and (d) allow for the creation of a multi-tenant, or hosted, processor and SoC service that produces custom, yet pre-verified, processors and SoCs. In the case of (d), the service can be extended all the way to the delivery of manufactured processors or SoCs either to a user or to a cloud environment, e.g. a $3^{rd}$ party receives the processor and installs it into a cloud where the user can control its operation.

One element supporting and undergirding multiple embodiments is the development and use of a number of conventions and templating to allow customer-provided parameters to dictate the delivered resource from a given service (see detailed discussion of the services, below). The conventions (e.g., think like main being the entry point for a C-program) together with the service-specific templating, or parameterization, are used to customize and then invoke commercial (and also open source) EDA tools. For example, chisel is an open source tool for hardware construction that uses a Scala program to generate register-transfer language such as Verilog. The user-defined design parameters discussed above and herein can be templated into a configuration, or provided as parameters, to say a general Chisel program for a RISC-V processor to produce a user-specific variant. The output from that can be used as design parameters for further services and so on. The point of this being that these technical approaches of conventions and templating/parameterization provide for tremendous flexibility to systematically automate a complex toolchain usage of EDA tools to produce a processor or SoC design that is verified, and potentially even emulated/simulated.

A web interface and/or a scripting application programming interface (API) may be provided for selecting a set of design parameter values associated with one or more template integrated circuit designs. The template designs may be encoded using conventions to facilitate modular design. A set of design parameter values is encoded in a design parameters data structure and passed to an automated system for generation and testing of an integrated circuit design using the chosen design parameter values. For example the design parameters of the design parameters data structure may include whether privilege modes are supported, whether multiply extension is supported, whether floating point extension is supported, whether error-correcting codes are supported in on-chip memory, the size of an instruction cache, an associativity of the instruction cache, a size of a data subsystem in on-chip memory, whether a port (e.g., a front port, a system port, a peripheral port, or a memory port) is included, a count of memory port channels, a port communication protocol selection, a bus width, a count of physical memory protection units, whether JTAG debugging is supported, a count of hardware breakpoints, whether instruction tracing is supported, whether debug direct memory access is supported, a count of local interrupts, whether a platform level interrupt controller is supported, a count of interrupt priority levels, a count of global interrupts, whether branch prediction is supported, a count of branch target buffer entries, a count of branch history table entries, and/or a selection of a manufacturing process.

For example, a single command issued from the web interface may trigger the automatic generation of register-transfer level data, a software development kit, documentation, and a physical design file (e.g., GDSII file) for an integrated circuit that embodies the selected design parameter values. The single command may also trigger the generation an execution of a test plan for the integrated circuit design that has been generated. The resulting design data and corresponding test results may be provided to a user as, for example, a set of files, an archive, or a repository (e.g., a GitHub repository). The system may also facilitate the manufacture of an integrated circuit (e.g., a processor or system-on-a-chip (SoC)) using the resulting design by actually manufacturing the integrated circuit or forwarding the physical design to an external foundry for manufacturing and tracking the progress of the fabrication, testing, shipping, and/or installation of the manufactured chips. The system may change the way chips are designed to allow non-specialists to customize a chip by selecting relatively simple design parameters, which may enable fast design space exploration of the actual RTL or physical chip. For example, a well-designed chip can be developed from a high level set of configuration settings using a mix of Diplomacy, Chisel, FIRRTL. The system may be implemented efficiently by using a single language (e.g., Scala) to control multiple task in a design pipeline. Embedding in a functional programming language may provide more flexibility and may increase designer/user productivity.

In some implementations, field programmable gate array (FPGA) and/or other emulation models of the integrated circuit design are generated and used for testing. An FPGA model may be loaded onto a cloud-based FPGA that is used for verification testing. The system may enable easy configuration of an IP core. Feedback (e.g., performance, power, and area estimates for the integrated circuit) may be provided during the process and keeping user updated about where ordered chips are (e.g., where is my chip within the fabrication process or shipment tracking). The system may provide price estimates for a design, i.e., how much will acquiring the resulting chips cost. For example, both NRE (non-recurring engineering cost) and per unit cost estimates may be provided. The system may use a template based chip design (e.g., start with a provider or 3 rd party-provided template of mix of IP/configurations. These chip or IP core templates can be open-sourced and/or private per user preference, which will be developed with a certain NRE.

Some implementations use a version control system (e.g., Git/GitHub) to maintain template designs and to store and/or share customized integrated circuit designs and associated data. A version control system may provide source code management functions and enable further customization of designs. The version control services may be targeted for advanced users who want to further customize the chip. For example after an initial design is automatically generated based on a set on design parameter values, a controller of the system may give them a repository (e.g., a Git) with the basic building blocks wired together. The user could now add additional IP cores or customize the source code. For example, a user could incorporate their custom IP cores or change the source code. For example, a user could extend the test plan or documentation by committing specific files to the repository.

For example, the existing items discussed above may behave by conventions. So, for example, a user could add chapters to the documentation in their custom IP core directory using the right conventions. In some implementations, an "IP store" can be provided to facilitate sharing of designs, where well designed IP cores that follow the conventions can be pulled into another design and all of the above processes work in an automated fashion on it. For example, these could be a full implementation or just FPGA demos already taped out. The IP store may enable programmatic installation of $3^{rd}$ party IP cores into a design. For example, a directory in Git that follows the applicable modular design conventions may be easily added/selected from a web application for the system. This ability to integrate the IP cores from multiple parties solves a challenging technical problem since cores from two different vendors might typically be pre-designed for different EDA design and verification tool usage/flows, e.g. one core may need additional different processing with EDA tools than another core.

In a first aspect, the subject matter described in this specification can be embodied in systems that include a web application server configured to generate a design parameters data structure based on input received, wherein the design parameters data structure includes values of design parameters of an integrated circuit design, and configured to display an auto-updating block diagram of a template design reflecting changes to values of the design parameters of the integrated circuit; a register-transfer level service module configured to generate a register-transfer level data structure for the integrated circuit based on the design parameters data structure; a software development kit service module configured to generate a software development kit for the integrated circuit based on the register-transfer level data structure; a physical design service module configured to generate a physical design data structure for the integrated circuit based on the register-transfer level data structure; a verification service module configured to generate a test plan for an integrated circuit based on the design parameters data structure and acceptance criteria; and a controller configured to access the design parameters data structure, invoke the register-transfer level service module with the design parameters data structure to obtain the register-transfer level data structure, invoke the software development kit service module with the register-transfer level data structure to obtain the software development kit, invoke the physical design service module with the register-transfer level data structure to obtain the physical design data structure, invoke the verification service module to obtain the test plan, and invoke tests for the integrated circuit based on the test plan, the register-transfer level data structure, the software development kit, and the physical design data structure to obtain a set of test results.

In a second aspect, the subject matter described in this specification can be embodied in methods that include accessing a design parameters data structure, wherein the design parameters data structure includes values of design parameters of an integrated circuit design; responsive to a command identifying the design parameters data structure, generating a register-transfer level data structure for an integrated circuit based on the design parameters data structure; responsive to the command identifying the design parameters data structure, generating a software development kit for the integrated circuit based on the register-transfer level data structure; responsive to the command identifying the design parameters data structure, generating a physical design data structure for the integrated circuit based on the register-transfer level data structure; responsive to the command identifying the design parameters data structure, generating a test plan for an integrated circuit based on the design parameters data structure and acceptance criteria; responsive to the command identifying the design parameters data structure, invoking tests for the integrated circuit based on the test plan, the register-transfer level data structure, the software development kit, and the physical design data structure to obtain a set of test results; and transmitting, storing, or displaying a design data structure based on the register-transfer level data structure, the software development kit, the physical design data structure, and the test results.

In a third aspect, the subject matter described in this specification can be embodied in systems that include a network interface, a memory, and a processor, wherein the memory includes instructions executable by the processor to cause the system to: access a design parameters data structure, wherein the design parameters data structure includes values of design parameters of an integrated circuit design; responsive to a command identifying the design parameters data structure, generate a register-transfer level data structure for an integrated circuit based on the design parameters data structure; responsive to the command identifying the design parameters data structure, generate a software development kit for the integrated circuit based on the register-transfer level data structure; responsive to the command identifying the design parameters data structure, generate a physical design data structure for the integrated circuit based on the register-transfer level data structure; responsive to the command identifying the design parameters data structure, generate a test plan for an integrated circuit based on the design parameters data structure and acceptance criteria; responsive to the command identifying the design parameters data structure, invoke tests for the integrated circuit based on the test plan, the register-transfer level data structure, the software development kit, and the physical design data structure to obtain a set of test results; and transmit, using the network interface, a design data structure based on the register-transfer level data structure, the software development kit, the physical design data structure, and the test results.

In a fourth aspect, the subject matter described in this specification can be embodied in methods that include receiving a design parameters file, wherein the design parameters file includes values of design parameters of an integrated circuit design; automatically generating a register-transfer level file, a software development kit, and a physical design file for an integrated circuit based on the design parameters file; and automatically invoking tests for the integrated circuit based on the register-transfer level file, the software development kit, and the physical design file to obtain a set of test results.

In a fifth aspect, the subject matter described in this specification can be embodied in systems that include a web application server configured to generate a design parameters data structure based on input received, wherein the design parameters data structure includes values of design parameters of an integrated circuit design, configured to display an auto-updating block diagram of a template design reflecting changes to values of the design parameters of the integrated circuit, and configured to issue a command to build the integrated circuit design; and a controller configured to, responsive to the command to build the integrated circuit design, access the design parameters data structure, invoke a register-transfer level service module with the design parameters data structure to obtain a register-transfer level data structure, invoke a software development kit service module with the register-transfer level data structure to obtain a software development kit, invoke a physical design service module with the register-transfer level data structure to obtain a physical design data structure, invoke a verification service module to obtain a test plan, and invoke tests for the integrated circuit based on the test plan, the register-transfer level data structure, the software development kit, and the physical design data structure to obtain a set of test results.

In a sixth aspect, the subject matter described in this specification can be embodied in methods that include accessing a design flow configuration data structure, wherein the design flow configuration data structure is encoded in a tool control language; based on the design flow configuration data structure, selecting multiple flowmodules from a set of flowmodules, wherein each flowmodule in the set of flowmodules provides an application programming interface, in the tool control language, to a respective electronic design automation tool; based on the design flow configuration data structure, generating a design flow as a directed acyclic graph including the selected flowmodules as vertices; generating an output integrated circuit design data structure, based on one or more input integrated circuit design data structures, using the design flow to control the respective electronic design automation tools of the selected flowmodules; and transmitting, storing, or displaying the output integrated circuit design data structure.

In a seventh aspect, the subject matter described in this specification can be embodied in systems that include a network interface, a memory, and a processor, wherein the memory includes instructions executable by the processor to cause the system to: access a design flow configuration data structure, wherein the design flow configuration data structure is encoded in a tool control language; based on the design flow configuration data structure, select multiple flowmodules from a set of flowmodules, wherein each flowmodule in the set of flowmodules provides an application programming interface, in the tool control language, to a respective electronic design automation tool; based on the design flow configuration data structure, generate a design flow as a directed acyclic graph including the selected flowmodules as vertices; and generate an output integrated circuit design data structure, based on one or more input integrated circuit design data structures, using the design flow to control the respective electronic design automation tools of the selected flowmodules.

In an eighth aspect, the subject matter described in this specification can be embodied in a non-transitory computer-readable storage medium that includes instructions that, when executed by a processor, facilitate performance of operations comprising: accessing a design flow configuration data structure, wherein the design flow configuration data structure is encoded in a tool control language; based on the design flow configuration data structure, selecting multiple flowmodules from a set of flowmodules, wherein each flowmodule in the set of flowmodules provides an application programming interface, in the tool control language, to a respective electronic design automation tool; based on the design flow configuration data structure, generating a design flow as a directed acyclic graph including the selected flowmodules as vertices; generating an output integrated circuit design data structure, based on one or more input integrated circuit design data structures, using the design flow to control the respective electronic design automation tools of the selected flowmodules; and transmitting, storing, or displaying the output integrated circuit design data structure.

FIG. 1 is block diagram of an example of a system 100 for facilitating design of integrated circuits. The system 100 includes an integrated circuit design service infrastructure 110 that processes requests received from a web client 102 and a scripting API client 104 via communications over a network 106. For example, the integrated circuit design service infrastructure 110 may be implemented as software running on one or more networked computing devices. For example, the integrated circuit design service infrastructure 110 may be implemented on the system 300 of FIG. 3. The integrated circuit design service infrastructure 110 includes a web application server 112; a scripting API server 114; and a controller 120 that determines integrated circuit designs using a collection of services (130, 140, 150, 160, 170, and 180) based design parameter values stored in a design parameters data structure 122. For example, the system 100 may implement the process 400 of FIG. 4. For example, the system 100 may implement the process 400 of FIG. 4. For example, the system 100 may implement the process 500 of FIG. 5. For example, the network 106 may be a local area network or a wide array network (e.g., the Internet).

The system 100 includes a web client 102 that may be used to interact with and control the integrated circuit design service infrastructure 110. For example, the web client 102 may include web browser software running a computing device (e.g., desktop computer, a laptop, a tablet, or a smartphone). The web client 102 may display a web interface generated by and received from the web application server 112. For example, the web interface may include design knobs that enable a user to select design parameter values for an integrated circuit design.

The system 100 includes a scripting API client 104 that may be used to interact with and control the integrated circuit design service infrastructure 110. For example, the scripting API client 104 may include a script (e.g., a Python script, a Java script, or a Ruby script) running a computing device (e.g., desktop computer, a laptop, a tablet, or a smartphone) that communicates with the scripting API server 114 via network communications (e.g., using a transport control protocol (TCP) session). The scripting API client 104 may generate API calls to the controller 120 and use the API calls to select design parameter values for one or more integrated circuit designs that are encoded in a design parameters data structure 122 (e.g., a design parameters file) and to command the controller 120 to generate and test the one or more integrated circuit designs based on the design parameters data structure 122. In some implementations, a script of the scripting API client 104 may be used to control iteration over a design space to test a large a large number of candidate permutations of design parameter values.

The integrated circuit design service infrastructure 110 includes a web application server 112 that generates a web interface to facilitate control of the integrated circuit design service infrastructure 110. The web interface may include configuration knobs (e.g., icons or fields) that can be used to select design parameter values for an integrated circuit design. The web application server 112 may be configured to generate a design parameters data structure 122 (e.g., a design parameter file or a design parameters database) based on input received (e.g., caused by user interaction with configuration knobs at the web client 102). The design parameters data structure 122 may include values of design parameters of an integrated circuit design. The design parameters data structure 122 may include a reference to a template design (e.g., a template design for an IP core), which may be modified based on the values of the design parameters. For example, the design parameters data structure 122 may include a JavaScript object notation (JSON) file with the values of the design parameters selected using knobs of the web interface. The web application server 112 may be configured to display an auto-updating block diagram of a template design reflecting changes to values of the design parameters of the integrated circuit (e.g., an IP core or a SoC). For example, the web application server 112 may generate the display region 1110 of FIG. 11. For example, the web application server 112 may generate the display region 1210 of FIG. 12. For example, the web application server 112 may generate the display region 1310 of FIG. 13. In some implementations, the web application server 112 is implemented as software (e.g., Python or Django front end tools) running on a same computing device as the controller 120. In some implementations, the web application server 112 is implemented as software running on a separate computing device from the controller 120. In some implementations, the web application server 112 communicates with the controller 120 via API calls and may even route the API calls to the controller via the scripting API server 114.

The web interface generated by the web application server 112 may include knobs for selecting a wide variety of design parameter values. For example, a knob can be used to select a binary design parameter (e.g., including a multiplier block or not including a multiplier block with a check box or radial button icon). For example, a knob can be used to select from a discrete list of options for a design parameter (e.g., selecting a manufacturing process using a drop-down menu). For example, a knob can be used to select a value (quantized) that varies over a range (e.g., a number of interrupts or a clock frequency may be adjusted by entering a value in a text field or by moving a slider icon). The web application server 112 may reflect dependencies between different design parameters by altering or disabling a knob based on a selection made with another knob of the web interface. Thus the selection of a design parameter value may constrain or limit the selection of other design parameters. For example, knobs relating to data cache design parameters may be disabled (e.g., grayed out) when a knob relating to a number of memory ports is used to select zero memory ports for inclusion in the integrated circuit.

The web interface generated by the web application server 112 may include an auto-updating block diagram that reflects current selections of design parameter values as the values are changed using knobs of the web interface. The auto-updating block diagram may provide a visual representation of the status of the design parameters data structure 122 that is being generated.

The web interface generated by the web application server 112 may include power, performance, and/or area estimates for a design based on current values of design parameters selected with knobs of the web interface. In some implementations, the power, performance, and/or area estimates may be updated in real-time responsive to changes made using the knobs of the web interface. For example, the web application server 112 may access a table of samples of the design space that is used as a model for power, performance, and area (PPA), and given a knob setting, these numbers may be calculated (e.g., using interpolation) from the model and instantly displayed. In some implementations, web interface generated by the web application server 112 may include power, performance, and/or area estimates that are determined based on a completely generated design available after a design based on the selected design parameter values has been generated and tested using the integrated circuit design service infrastructure 110.

The web interface generated by the web application server 112 may include an icon that may be used to issue a command to the controller 120 to build an integrated circuit design based on a set of design parameter values encoded in a design parameters data structure. The web interface generated by the web application server 112 may provide status updates on the integrated circuit design as it is generated, tested, and/or manufactured.

The integrated circuit design service infrastructure 110 includes a scripting API server 114 that is configured to receive and convey API calls to the controller 120. For example, the scripting API server 114 may facilitate network communications (e.g., using TCP) between the controller 120 and the scripting API client 104. The scripting API server 114 may be used to generate a design parameters data structure 122 (e.g., a design parameter file or a design parameters database) based on input received via an application programming interface. For example, the API of the controller 120 may be a representational state transfer (REST) API. Using the scripting API may enable users to easily test a wide variety of design parameter value selections to search a design space efficiently. For example, a user can write a script to programmatically test thousands of designs in the cloud with small parameter tweaks. Automated regression testing may be enabled. Users may write customized controllers that call APIs.

The integrated circuit design service infrastructure 110 includes a controller 120 configured to generate an integrated circuit design based on a design parameters data structure 122 and test the design. For example, the controller 120 may be configured to access the design parameters data structure 122, invoke the register-transfer level service module 130 with the design parameters data structure 122 to obtain the register-transfer level data structure 132, invoke the software development kit service module 140 with the register-transfer level data structure 132 to obtain the software development kit 142, invoke the physical design service module 160 with the register-transfer level data structure 132 to obtain the physical design data structure 162, invoke the verification service module 180 to obtain the test plan 182, and invoke tests for the integrated circuit based on the test plan 182, the register-transfer level data structure 132, the software development kit 142, and the physical design data structure 162 to obtain a set of test results 190. The controller 120 may include an application programming interface that enables scripting (e.g., via the scripting API server 114) to process multiple design parameters data structures. For example, the controller 120 may perform the actions to generate the integrated circuit design responsive to a command to build the integrated circuit design that is issued be the web application server 112 or the scripting API server 114. For example, the controller 120 may be implemented as software running on the system 300 of FIG. 3.

For example, the controller 120 may be implemented as cloud service. The controller 120 may implement a sequenced build pipeline for an integrated circuit design based on the design parameters in a design parameter data structure (e.g., a design parameter file). For example, the integrated circuit may be an IP core. For example, the integrated circuit may be a system-on-a-chip. The controller 120 may utilize pre-configured semantics for the inputs and services that work off of the outputs of previous stages in a design building pipeline. The controller 120 may take a design parameter data structure (e.g., a JSON file) as input from the web application server 112 or the scripting API server 114 and output a design data structure (e.g., a compressed archive of design files and/or test results for an integrated circuit design) that includes outputs from various services (130, 140, 150, 160, 170, and/or 180) used in the sequenced design pipeline. For example, the design pipeline implemented by the controller 120 may include four stages. In a first stage, the register-transfer level service module 130 may be invoked to generate a register-transfer level data structure 132 based on the design parameters data structure 122. In a second stage, multiple design services that depend on the register-transfer level data structure may be invoked in parallel to generate respective design related data structures. For example, the software development kit service module 140, the documentation service module 150, the physical design service module 160, and the field programmable gate array design service may be invoked in parallel or in any sequence to generate a software development kit 142, documentation 152, a physical design data structure (e.g., a GDSII file), and a field programmable gate array emulation data structure 172 (e.g., an FPGA emulation file) based on the register-transfer level data structure 132 and the design parameters data structure 122. In a third stage, the verification service module 180 may be invoked to generate a test plan 182 and the test plan 182 may be executed by invoking tests to obtain test results 190 for the integrated circuit design. For example, the design verification tests may depend on the register-transfer level data structure 132, the software development kit 142, physical design data structure 162, and/or the field programmable gate array emulation data structure 172. For example, the invoked verification tests may be executed directly by the controller 120, by the verification service module 180, and/or by an external service (e.g., a cloud based FPGA or emulation service that is accessed via communications over the network 106). In a fourth stage, the verified integrated circuit design may fabricated. For example, fabrication may be initiated by sending (e.g., via communications over the network 106) a design data structure based on the physical design data structure (e.g., a GDSII file) to a server of an integrated circuit manufacturing facility. In some implementations (not shown in FIG. 1), integrated circuit fabrication equipment used to fabricate the integrated circuit may be included in the integrated circuit design service infrastructure 110.

The controller 120 may be configured to handle reporting errors and/or feedback to the web application server 112 for relay to the web client 102. The controller 120 may be configured to handle multiple requests from other tenants/companies/users. The controller 120 may be configured to manage workloads in the cloud. The controller 120 may be configured to inform a user where to get the results of the design pipeline (e.g., fabricated chips and/or design test results). For example, the controller 120 may be configured to orchestrate or manage launching the FPGA in a cloud environment for testing and provide login credentials back to the web application server 112 for relay to the web client 102.

In some implementations, the controller 120 may return a generated integrated circuit design as a repository (e.g. GitHub repository) with the basic building blocks wired together. A user with access to the repository could now add additional IP cores or customize the source code. For example, a generated design data structure may be transmitted to or stored by the controller 120 to a GitHub repository and access credentials for the GitHub repository may be delivered to the user (e.g., via the web interface).

The integrated circuit design service infrastructure 110 includes a register-transfer level service module 130 configured to generate a register-transfer level data structure 132 for the integrated circuit based on the design parameters data structure 122. For example, the register-transfer level service module 130 may be implemented as Scala code. For example, the register-transfer level service module 130 may be implemented using Scala code. For example, the register-transfer level service module 130 may be implemented using Chisel (available at https://chisel.eecs.berkeley.edu/chisel-dac2012.pdf). For example, the register-transfer level service module 130 may be implemented using FIRRTL (flexible intermediate representation for register-transfer level) (available at https://aspire.eecs.berkeley.edu/wp/wp-content/uploads/2017/11/Specification-for-the-FIRRTL-Language-Izraelevitz.pdf). For example, the register-transfer level service module 130 may be implemented using Diplomacy (available at https://carrv.github.io/2017/papers/cook-diplomacy-carrv2017.pdf). For example, the register-transfer level service module 130 may enable a well-designed chip to be automatically developed from a high level set of configuration settings using a mix of Diplomacy, Chisel, FIRRTL. The register-transfer level service module 130 may take the design parameters data structure 122 (e.g., a JSON file) as input and output a register-transfer level data structure (e.g., a Verilog file) for the chip and/or selected core IP per the design parameters of the design parameters data structure (e.g., as specified using configuration knobs of the web interface generated by the web application server 112). The register-transfer level data structure may include updated configuration settings to drive future stages of the design pipeline. For example, the updated configuration settings may include a concrete memory map of the core, an actual port, a clock design, floorplan information, and/or other configuration information determined by the register-transfer level service module 130). For example, the process 600 of FIG. 6 may be implemented to generate a register-transfer level data structure 132 for the integrated circuit based on the design parameters data structure 122.

The integrated circuit design service infrastructure 110 includes a software development kit service module 140 configured to generate a software development kit 142 for the integrated circuit based on the register-transfer level data structure 132. For example, the software development kit service module 140 may access an existing toolchain or software development kit for a template integrated circuit design that is identified by the design parameters data structure 122. The existing toolchain or software development kit (e.g., a RISC-V toolchain/SDK) may be set up using conventions suitable for configurability. For example, the existing toolchain or software development kit may be organized into submodules corresponding to design parameters of the design parameters data structure 122. The software development kit service module 140 may enable generalizing the existing toolchain or software development kit to respond to values of design parameters in the design parameters data structure 122. The software development kit service module 140 may take the register-transfer level data structure 132 as input and generate the software development kit 142 based on the register-transfer level data structure 132 and/or the design parameters data structure 122. For example, the software development kit 142 may include a compiler, an assembler, header files, libraries, boot loaders, kernel drivers, and/or other tools for a fully functional SDK/computing environment. For example, the software development kit service module 140 may be implemented as a Python script running on the system 300 of FIG. 3. In some implementations, the software development kit service module 140 is configured to parse the register-transfer level data structure 132, generate options for the tools and builds, generate header files responsive to a memory map, selects appropriate examples from the existing toolchain or software development kit, generate relevant configuration files for target simulators (e.g., QEMU (Quick Emulator)) so they can run your specific design on another processor (e.g., x86), and generate loaders for Verilog simulators and physical FPGA boards to be flashed. The resulting software development kit 142 may be built and tested in the cloud (e.g., before giving to customer), which may provide high value where we know these things work in this configuration. The resulting software development kit 142 may be registered with the controller 120 for delivery to a user (e.g., via the web interface.

The integrated circuit design service infrastructure 110 includes a documentation service module 150 configured to generate documentation 152 for the integrated circuit based on the register-transfer level data structure 132. For example, the documentation service module 150 may utilize Prince (available at https://www.princexml.com/). For example, the documentation service module 150 may utilize ASCII Doc (available at http://asciidoc.org/). For example, the documentation service module 150 may access a pre-loaded modular manual for a template integrated circuit design that is identified by the design parameters data structure 122. The modular manual may be set up using conventions suitable for configurability. For example, the modular manual may be organized into submodules corresponding to design parameters of the design parameters data structure 122. In some implementations, the modular manual is stored as multiple components in corresponding directories of an existing SDK for the template. The documentation service module 150 may enable generalizing the pre-loaded modular manual to respond to values of design parameters in the design parameters data structure 122. For example, documentation 152 for a RISC-V chip without a multiplier may omit documentation about a multiplication instruction, or similarly, documentation 152 for a RISC-V chip with vector extensions may be generated to include suitable documentation for the vector extensions. The documentation service module 150 may take the register-transfer level data structure 132 as input and generate the documentation 152 (e.g., in an HTML and/or a PDF format) based on the register-transfer level data structure 132 and/or the design parameters data structure 122. The documentation service module 150 may correctly document the memory map/ports by working with the post-RTL output. For example, the documentation service module 150 may utilize a documentation framework similar to the React framework (e.g., a JS HTML framework). In some implementations, documentation blocks have a respective piece of python code that takes in an RTL output configuration file and breaks it down into the chunks that ASCII Doc requires and invokes content generation. For example, the documentation service module 150 may implement the process 800 of FIG. 8. In some implementations, the documentation 152 is output in both the HTML format and in the PDF format. For example, the documentation 152 generated may be registered with the controller 120 to enable packaging for a user (e.g., for delivery in an archive or other data structure to the web client 102).

The integrated circuit design service infrastructure 110 includes a physical design service module 160 configured to generate a physical design data structure 162 for the integrated circuit based on the register-transfer level data structure 132. For example, the physical design service module 160 may utilize proprietary or open source synthesis and place & route tools (e.g., Synopsys, Cadence, and/or Mentor tools). For example, the physical design service module 160 may utilize Synopsys tools, including Design Compiler, IC Compiler, PrimeTime, Formality, and/or StarExtract. For example, the physical design service module 160 may implement logical equivalent checking. For example, the physical design service module 160 may utilize static timing analysis tools. For example, the physical design service module 160 may implement design rule checking (DRC) and/or layout versus schematic (LVS) checking. For example, the physical design service module 160 may enable quick iteration of a design and provide feedback (e.g., power, performance, and area estimates) to a user in a more digestible format, which may add value. For example, the physical design service module 160 may report back in less-technical terms whether there are any issues, parallelize and balance the workloads, and highlight important components of the output of the tools that are included in the physical design data structure 162. The physical design service module 160 may take the register-transfer level data structure 132 (e.g., Verilog and/or floorplan guidance) as input and generate the physical design data structure 162 (e.g., including a GDSII file or an OASIS file) based on the register-transfer level data structure 132 and/or the design parameters data structure 122. For example, the physical design service module 160 may implement the process 700 of FIG. 7. In some implementations, the physical design service module 160 may manage and orchestrate physical design toolchains in a cloud. For example, the physical design service module 160 may manage license files, manage computing resources (e.g., CPU cycles, memory, and/or disk usage) and balance user willingness to pay versus speed of results, handle database movement from tool to tool, and manage access to third party IP cores (e.g., some users/tenants using the integrated circuit design service infrastructure 110 may lack access rights to some IP cores available for customization to other users/tenants). For example, a user may input service and/or pricing preferences through the web interface generated by the web application server 112. For example, the physical design service module 160 may use templated designs, which may allow for significant design reuse and physical design service module 160 may identify those combinations and reduce workload. For example, the physical design service module 160 may provide better or more compact error/issue reporting, by translating tool issues into manageable feedback and providing the actual error/output of tools in a deliverable format to a user (e.g., a user of the web client 102). In some implementations, the physical design service module 160 may find common pairings (e.g., DDR control and PHY) that are commonly used across multiple designs. Physical design blocks for the identified pairings may be reused across designs to improve efficiency. In some implementations, the physical design service module 160 may be configured to learn from previous physical design attempts, and automatically adjusts certain parameters for the next attempt. For example, while being invoked to produce a chip that meets a certain performance benchmark while staying under a certain area/power consumption constraint that has not yet been met (e.g., not fast enough or too big or power hungry), the physical design service module 160 may propose suggested alternate parameters or just iterate in a direction that seeks towards closer fit to requirements.

The integrated circuit design service infrastructure 110 includes a field programmable gate array service module 170 configured to generate a field programmable gate array emulation data structure 172 for the integrated circuit based on the register-transfer level data structure 132 and the software development kit 142. For example, the field programmable gate array service module 170 may be configured to utilize a cloud based field programmable gate array (FPGA). For example, the field programmable gate array service module 170 may be configured to utilize a cloud based FPGA synthesis tool. For example, the field programmable gate array service module 170 may be configured to utilize emulation platforms, such as, Palladium (from Cadence), Veloce (from Mentor Graphics), and/or Zebu (from Synopsys). For example, the field programmable gate array service module 170 may enable a user who lacks knowledge of how to build for these complex platforms to generate a working file for FPGA testing (e.g., in the cloud). For example, the field programmable gate array service module 170 may be configured to handle emulating devices hard drives and network devices. For example, the field programmable gate array service module 170 may provide login to a user (e.g., a user of the web client 102) to enable the user login to a chip and run benchmarks easily. For example, the field programmable gate array service module 170 may take the register-transfer level data structure 132 and the software development kit 142 as input and generate the field programmable gate array emulation data structure 172 (e.g., an emulation file and supporting materials) based on the register-transfer level data structure 132, the software development kit 142, and/or the design parameters data structure 122. Once the design is available in a register-transfer level format (e.g., as Verilog), the field programmable gate array service module 170 may generate files to enable the design to be run either in an FPGA or on an emulation platform. In some implementations, the field programmable gate array service module 170 may provide the illusion of the whole system, including peripherals, operating together (e.g., memory timing needs to be matched). For example, the peripherals emulated may be the actual peripherals a user has selected in the web interface generated by the web application server 112. For example, if the user has selected a chip to have a 64-bit DDR interface, the FPGA service may build an FPGA model that gives the end-user the illusion that the emulated chip has a 64-bit interface. For example, if the user has selected that the chip has a display controller, the FPGA service should provide an emulation environment with a display controller. For example, the field programmable gate array service module 170 may implement highly detailed use of existing tools based on the parameterized integrated circuit design. For example, the field programmable gate array service module 170 may be configured to use the FPGA/Emulator toolchain, be configured to setup the emulated devices, be configured to compile the emulated devices, load the emulated devices into requested cloud(s), and provides login and/or start the requested benchmarks and returns results as part of the test results 190. For example, the field programmable gate array service module 170 may register a final FPGA/emulator design and/or credentials (e.g., a login and password) back to the controller 120. In some implementations, the controller 120 is configured to invoke a test using a field programmable gate array, programmed based on the field programmable gate array emulation data structure 172, to obtain an emulation result, wherein the field programmable gate array is operating on a cloud server. For example, the controller may use the credentials to invoke the test on the field programmable gate array operating on a cloud server.

The integrated circuit design service infrastructure 110 includes a verification service module 180 configured to generate a test plan 182 for an integrated circuit based on the design parameters data structure 122 and acceptance criteria. For example, the verification service module 180 may be configured to utilize Verilog simulators (e.g., open source Verilog simulators). For example, the verification service module 180 may be configured to utilize FPGAs. For example, the verification service module 180 may be configured to utilize software simulators, such as Quick Emulator (QEMU), Spike, and/or other software simulators. In some implementations, multiple target test platforms look the same so the verification service module 180 is able to easily move the workloads across different cost options (e.g., using physical FPGAs vs. cheaper using pre-emptible cloud instances). For example, the verification service module 180 may take the register-transfer level data structure 132 (e.g., including Verilog RTL), the software development kit 142, a physical design data structure (e.g., including a GDSII file), a corpus of tests, and corresponding acceptance criteria as input and generates a test plan 182 and/or test results 190 for the integrated circuit design. For example, the inputs to the verification service module 180 may be provided by the controller 120. In some implementations, a user-defined controller or a more parameterized controller, are configured to respond to varying acceptance criteria. Given acceptance criteria and a design configuration, a test plan may be generated automatically. For example, the verification service module 180 may be configured to define environments, filter out tests it cannot run given a corpus of tests and a hardware and software design generated based on the design parameters data structure 122, generate the test plan 182 to include a sequence of selected tests for the integrated circuit design. For example, an environment may define a test platform. There may be additional components in the test bench, outside the device under test, and it may be beneficial to standardize these environments across designs. For example, a way to end a test may be standardized within a test platform. Some test platforms may define a register a CPU can write to that is defined within the test bench, while some test platforms will wiggle a general purpose input/output (GPIO) pin in a certain way. Given a test plan 182, many test platforms may be used for all tests. In some implementations, the verification service module 180 may execute or otherwise invoke the testing in accordance with the test plan 182 and gather results to be included in the test results 190. For example, the test plan 182 and/or some or all of the test results 190 may be reported back to the controller 120.

Figure 2:
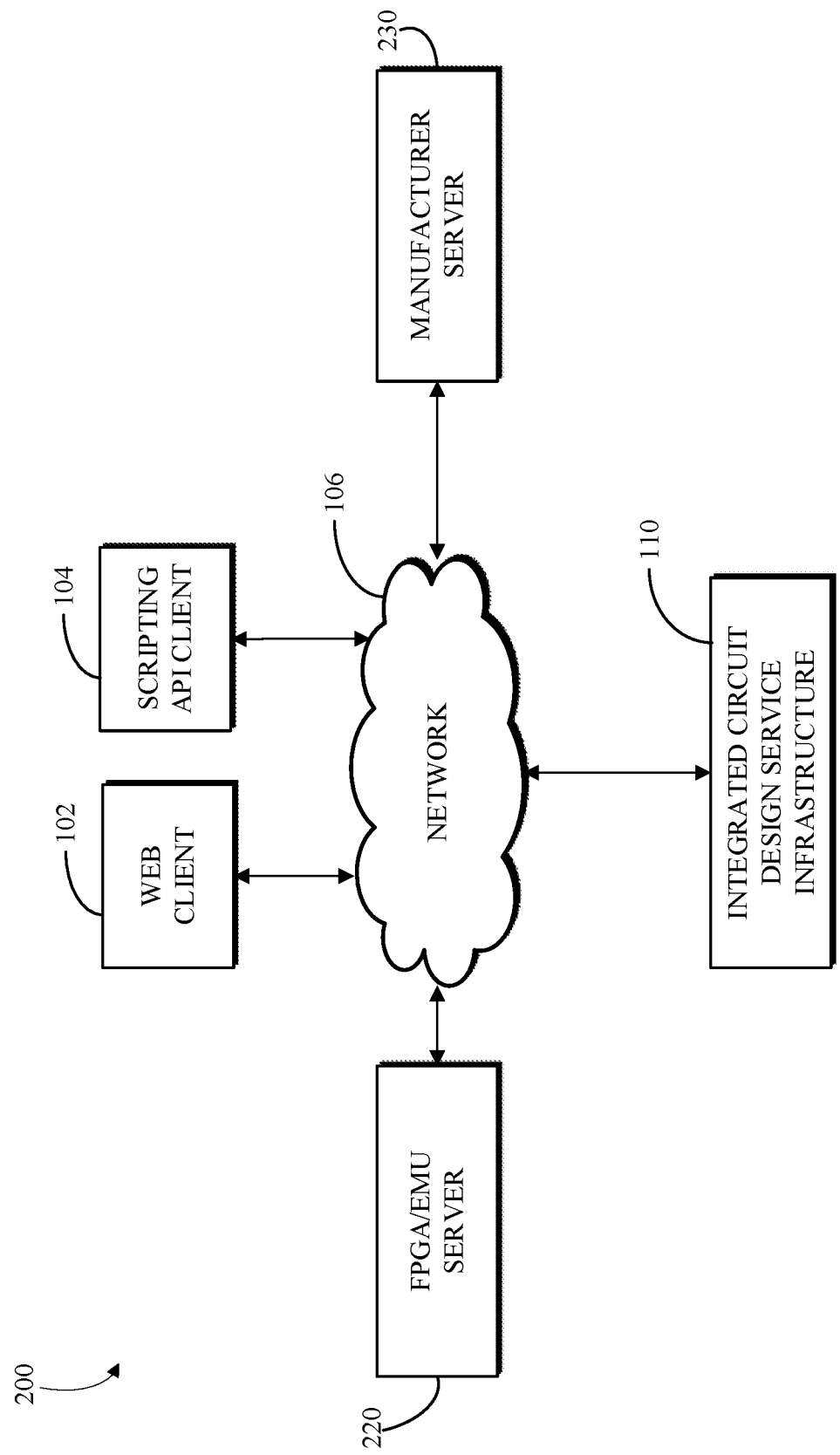
FIG. 2 is block diagram of an example of a system for facilitating design and manufacture of integrated circuits.

FIG. 2 is block diagram of an example of a system 200 for facilitating design and manufacture of integrated circuits. The system 200 includes the web client 102, the scripting API client 104, the network 106, the integrated circuit design service infrastructure 110, an FPGA/emulator server 220, and a manufacturer server 230. For example, a user may utilize the web client 102 or the scripting API client 104 to command the integrated circuit design service infrastructure 110 to automatically generate an integrated circuit design based a set of design parameter values selected by the user for one or more template integrated circuit designs.

For example, the integrated circuit design service infrastructure 110 may invoke (e.g., via network communications over the network 106) testing of the resulting design that is performed by the FPGA/emulation server 220 that is running one or more FPGAs or other types of hardware or software emulators. For example, the integrated circuit design service infrastructure 110 may invoke a test using a field programmable gate array, programmed based on the field programmable gate array emulation data structure 172, to obtain an emulation result. The field programmable gate array may be operating on the FPGA/emulation server 220, which may be a cloud server. Test results may be returned by the FPGA/emulation server 220 to the integrated circuit design service infrastructure 110 and relayed in a useful format to the user (e.g., via the web client 102 or the scripting API client 104).

The integrated circuit design service infrastructure 110 may also facilitate the manufacture of integrated circuits using the integrated circuit design in a manufacturing facility associated with the manufacturer server 230. In some implementations, a physical design specification (e.g., a GDSII file) based on the physical design data structure 162 is transmitted to the manufacturer server 230 to invoke manufacturing of the integrated circuit (e.g., using manufacturing equipment of the associated manufacturer). For example, the manufacturer server 230 may host a foundry tape out website that is configured to receive physical design specifications (e.g., as a GDSII file or an OASIS file) to schedule or otherwise facilitate fabrication of integrated circuits. In some implementations, the integrated circuit design service infrastructure 110 supports multi-tenancy to allow multiple integrated circuit designs (e.g., from one or more users) to share fixed costs of manufacturing (e.g., reticle/mask generation, and/or shuttles wafer tests). For example, the integrated circuit design service infrastructure 110 may use a fixed package (e.g., a quasi-standardized packaging) that is defined to reduce fixed costs and facilitate sharing of reticle/mask, wafer test, and other fixed manufacturing costs. For example, the physical design specification may include one or more physical designs from one or more respective physical design data structures in order to facilitate multi-tenancy manufacturing. For example, the integrated circuit design service infrastructure 110 may implement the process 900 of FIG. 9 to generate a multi-tenant physical design specification.

In response to the transmission of the physical design specification, the manufacturer associated with the manufacturer server may fabricate and test integrated circuits based on the integrated circuit design. For example, the associated manufacturer (e.g., a foundry) may perform optical proximity correction (OPC) and similar post-tapeout/ pre-production processing, fabricate the integrated circuit(s), update the integrated circuit design service infrastructure 110 (e.g., via communications with the controller 120 or the web application server 112) periodically or asynchronously on the status of the manufacturing process, performs appropriate testing (e.g., wafer testing) and send to packaging house for packaging. A packaging house may receive the finished wafers or dice from the manufacturer and test materials, and update the integrated circuit design service infrastructure 110 (e.g., via communications with the controller 120 or the web application server 112) on the status of the packaging and delivery process periodically or asynchronously. In some implementations, status updates may be relayed to the user when the user checks in using the web interface and/or the controller might email the user that updates are available.

In some implementations, the resulting integrated circuits (e.g., physical chips) are delivered (e.g., via mail) to the user. In some implementations, the resulting integrated circuits (e.g., physical chips) are installed in a system controlled by a cloud server making them quickly accessible to be run remotely using network communications to control the operation of the integrated circuits. For example, a login to the cloud server controlling a manufactured integrated circuit may be sent to the integrated circuit design service infrastructure 110 and relayed to a user (e.g., via the web client 102). For example, the process 1000 of FIG. 10 may be implemented by the manufacturer.

Figure 3:
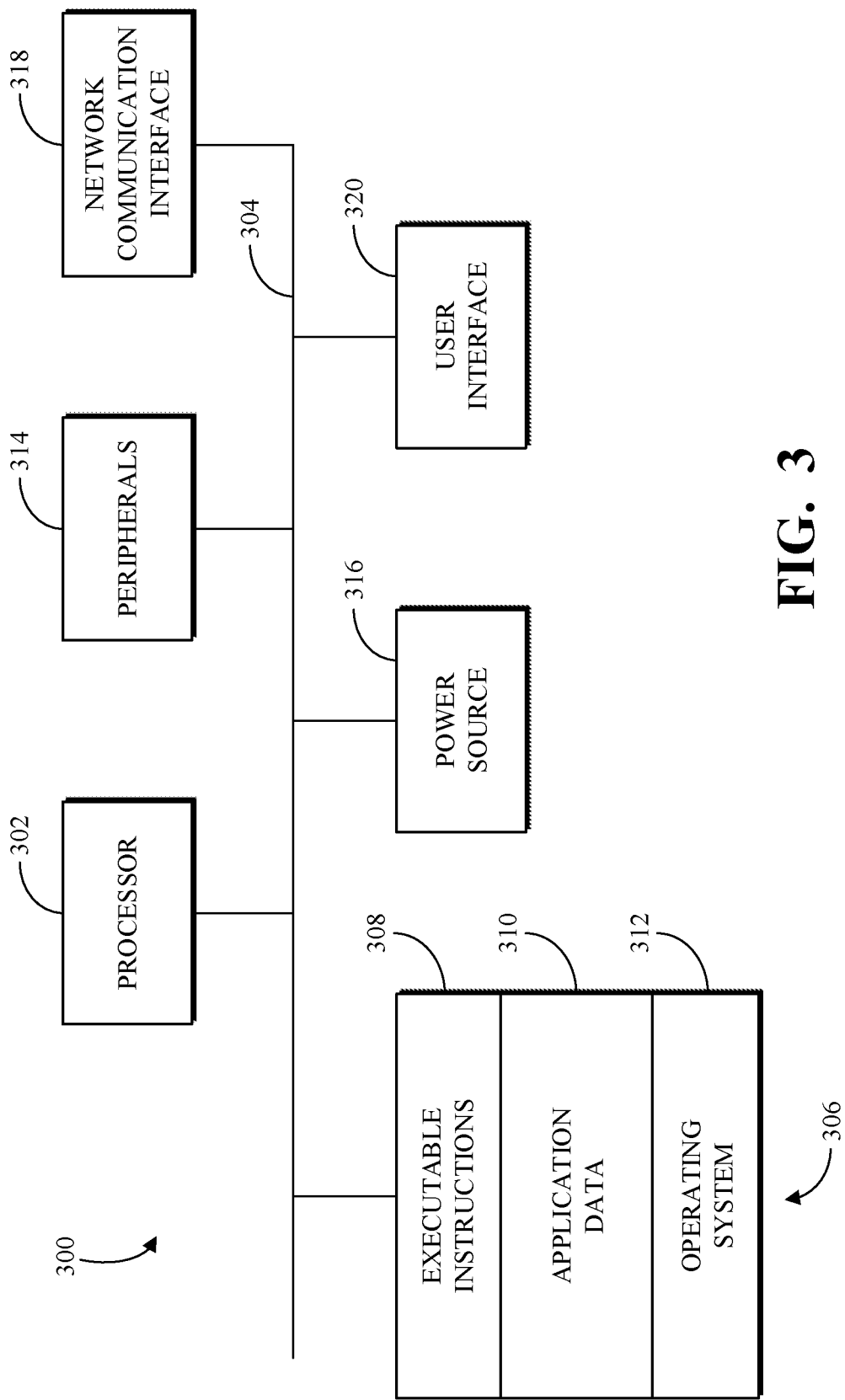
FIG. 3 is block diagram of an example of a system for facilitating design of integrated circuits.

FIG. 3 is block diagram of an example of a system 300 for facilitating design of integrated circuits. The system 300 is an example of an internal configuration of a computing device that may be used to implement the integrated circuit design service infrastructure 110 as a whole or one or more components of the integrated circuit design service infrastructure 110 of the system 100 shown in FIG. 1. The system 300 can include components or units, such as a processor 302, a bus 304, a memory 306, peripherals 314, a power source 316, a network communication interface 318, a user interface 320, other suitable components, or a combination thereof.

The processor 302 can be a central processing unit (CPU), such as a microprocessor, and can include single or multiple processors having single or multiple processing cores. Alternatively, the processor 302 can include another type of device, or multiple devices, now existing or hereafter developed, capable of manipulating or processing information. For example, the processor 302 can include multiple processors interconnected in any manner, including hardwired or networked, including wirelessly networked. In some implementations, the operations of the processor 302 can be distributed across multiple physical devices or units that can be coupled directly or across a local area or other suitable type of network. In some implementations, the processor 302 can include a cache, or cache memory, for local storage of operating data or instructions.

The memory 306 can include volatile memory, non-volatile memory, or a combination thereof. For example, the memory 306 can include volatile memory, such as one or more DRAM modules such as DDR SDRAM, and non-volatile memory, such as a disk drive, a solid state drive, flash memory, Phase-Change Memory (PCM), or any form of non-volatile memory capable of persistent electronic information storage, such as in the absence of an active power supply. The memory 306 can include another type of device, or multiple devices, now existing or hereafter developed, capable of storing data or instructions for processing by the processor 302. The processor 302 can access or manipulate data in the memory 306 via the bus 304. Although shown as a single block in FIG. 3, the memory 306 can be implemented as multiple units. For example, a system 300 can include volatile memory, such as RAM, and persistent memory, such as a hard drive or other storage.

The memory 306 can include executable instructions 308, data, such as application data 310, an operating system 312, or a combination thereof, for immediate access by the processor 302. The executable instructions 308 can include, for example, one or more application programs, which can be loaded or copied, in whole or in part, from non-volatile memory to volatile memory to be executed by the processor 302. The executable instructions 308 can be organized into programmable modules or algorithms, functional programs, codes, code segments, or combinations thereof to perform various functions described herein. For example, the executable instructions 308 can include instructions executable by the processor 302 to cause the system 300 to automatically, in response to a command, generate an integrated circuit design and associated test results based on a design parameters data structure. The application data 310 can include, for example, user files, database catalogs or dictionaries, configuration information or functional programs, such as a web browser, a web server, a database server, or a combination thereof. The operating system 312 can be, for example, Microsoft Windows®, Mac OS X®, or Linux®, an operating system for a small device, such as a smartphone or tablet device; or an operating system for a large device, such as a mainframe computer. The memory 306 can comprise one or more devices and can utilize one or more types of storage, such as solid state or magnetic storage.

The peripherals 314 can be coupled to the processor 302 via the bus 304. The peripherals 314 can be sensors or detectors, or devices containing any number of sensors or detectors, which can monitor the system 300 itself or the environment around the system 300. For example, a system 300 can contain a geospatial location identification unit, such as a global positioning system (GPS) location unit. As another example, a system 300 can contain a temperature sensor for measuring temperatures of components of the system 300, such as the processor 302. Other sensors or detectors can be used with the system 300, as can be contemplated. In some implementations, the power source 316 can be a battery, and the system 300 can operate independently of an external power distribution system. Any of the components of the system 300, such as the peripherals 314 or the power source 316, can communicate with the processor 302 via the bus 304.

The network communication interface 318 can also be coupled to the processor 302 via the bus 304. In some implementations, the network communication interface 318 can comprise one or more transceivers. The network communication interface 318 can, for example, provide a connection or link to a network, such as the network 106, via a network interface, which can be a wired network interface, such as Ethernet, or a wireless network interface. For example, the system 300 can communicate with other devices via the network communication interface 318 and the network interface using one or more network protocols, such as Ethernet, TCP, IP, power line communication (PLC), WiFi, infrared, GPRS, GSM, CDMA, or other suitable protocols.

A user interface 320 can include a display; a positional input device, such as a mouse, touchpad, touchscreen, or the like; a keyboard; or other suitable human or machine interface devices. The user interface 320 can be coupled to the processor 302 via the bus 304. Other interface devices that permit a user to program or otherwise use the system 300 can be provided in addition to or as an alternative to a display. In some implementations, the user interface 320 can include a display, which can be a liquid crystal display (LCD), a cathode-ray tube (CRT), a light emitting diode (LED) display (e.g., an OLED display), or other suitable display.

In some implementations, a client or server can omit the peripherals 314. The operations of the processor 302 can be distributed across multiple clients or servers, which can be coupled directly or across a local area or other suitable type of network. The memory 306 can be distributed across multiple clients or servers, such as network-based memory or memory in multiple clients or servers performing the operations of clients or servers. Although depicted here as a single bus, the bus 304 can be composed of multiple buses, which can be connected to one another through various bridges, controllers, or adapters.

Figure 4:
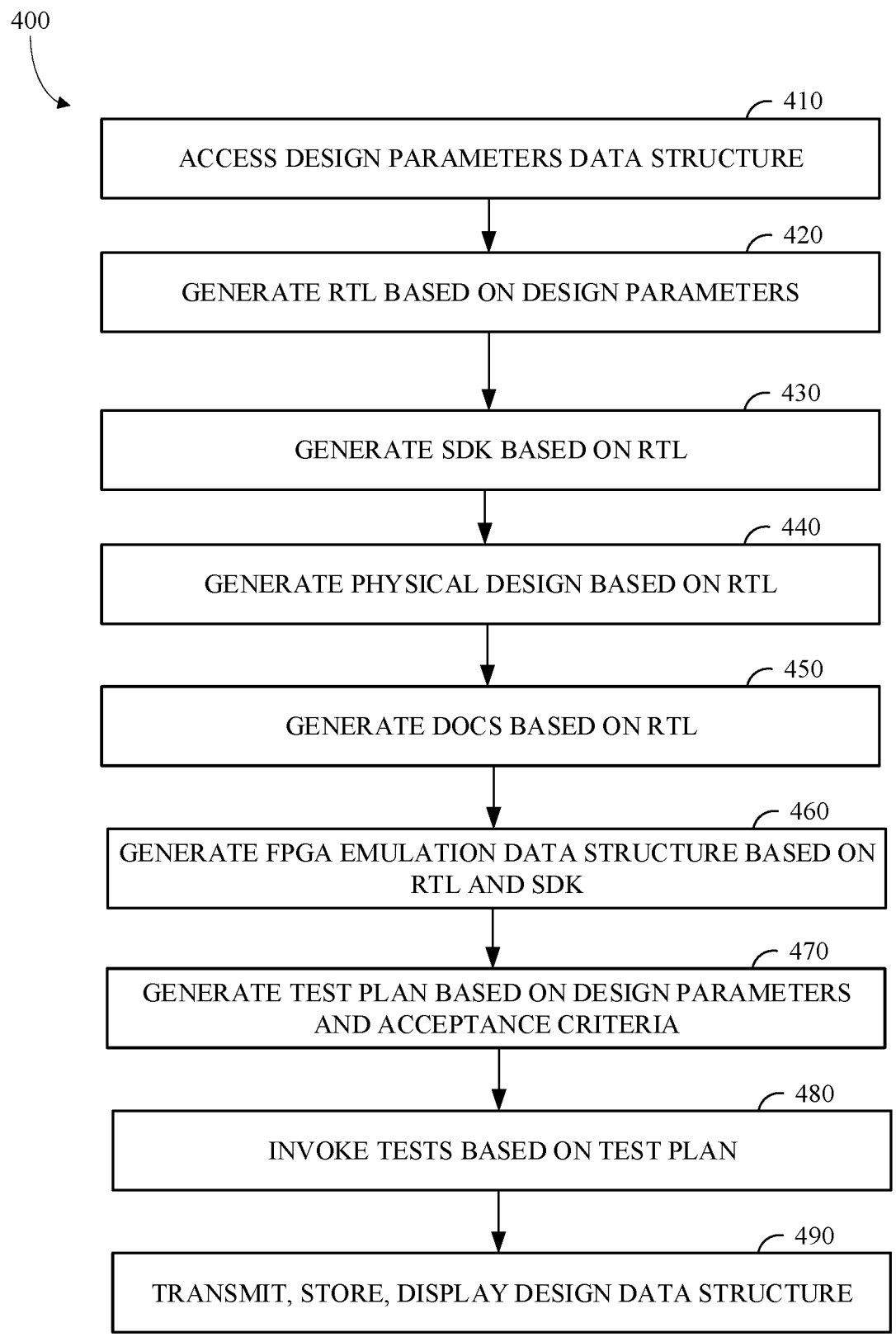
FIG. 4 is flow chart of an example of a process for facilitating design of integrated circuits.

FIG. 4 is flow chart of an example of a process 400 for facilitating design of integrated circuits. The process 400 includes accessing 410 a design parameters data structure; generating 420 a register-transfer level data structure for an integrated circuit based on the design parameters data structure; generating 430 a software development kit for the integrated circuit based on the register-transfer level data structure; generating 440 a physical design data structure for the integrated circuit based on the register-transfer level data structure; generating 450 documentation for the integrated circuit based on the register-transfer level data structure; generating 460 a field programmable gate array emulation data structure for the integrated circuit based on the register-transfer level data structure and the software development kit; generating 470 a test plan for an integrated circuit based on the design parameters data structure and acceptance criteria; invoking 480 tests for the integrated circuit based on the test plan, the register-transfer level data structure, the software development kit, and the physical design data structure to obtain a set of test results; and transmitting, storing, or displaying 490 a design data structure based on the register-transfer level data structure, the software development kit, the physical design data structure, and the test results. The process 400 may automatically generate and test an integrated circuit design conforming to design parameter values in a design parameters data structure in response to a single command (e.g., a build command). For example, the process 400 may be implemented by the integrated circuit design service infrastructure 110. For example, the process 400 may be implemented by the system 100 of FIG. 1. For example, the process 400 may be implemented by the system 300 of FIG. 3.

The process 400 includes accessing 410 a design parameters data structure (e.g., a file, a database, a repository, or a bitstream). The design parameters data structure includes values of design parameters of an integrated circuit design. For example, the integrated circuit design may be of an IP core. For example, the integrated circuit design may be of a system-on-a-chip. For example, the design parameters data structure may include a JSON file. For example the design parameters of the design parameters data structure may include whether privilege modes are supported, whether multiply extension is supported, whether floating point extension is supported, whether error-correcting codes are supported in on-chip memory, the size of an instruction cache, an associativity of the instruction cache, a size of a data subsystem in on-chip memory, whether a port (e.g., a front port, a system port, a peripheral port, or a memory port) are included, a count of memory port channels, a port communication protocol selection, a bus width, a count of physical memory protection units, whether JTAG debugging is supported, a count of hardware breakpoints, whether instruction tracing is supported, whether debug direct memory access is supported, a count of local interrupts, whether a platform level interrupt controller is supported, a count of interrupt priority levels, a count of global interrupts, whether branch prediction is supported, a count of branch target buffer entries, a count of branch history table entries, and/or a selection of a manufacturing process. For example, the design parameters data structure may be accessed 410 by receiving the design parameters data structure (e.g., via network communications with the web client 102 or the scripting API client 104 using the network communications interface 318). For example, the design parameters data structure may be accessed 410 by reading the design parameters data structure (e.g., reading from the memory 306 via the bus 304).

The process 400 includes, responsive to a command identifying the design parameters data structure, generating 420 a register-transfer level data structure for an integrated circuit based on the design parameters data structure. For example, command may be a build command issued by a user through an icon of a web interface of the web application server 112 using the web client 102. For example, command may be a build command issued by a script running on the scripting API client 104 via the scripting API server 114. The command may identify the design parameters data structure either explicitly or implicitly. For example, the command may identify the design parameters data structure by being sent with a copy of the design parameters data structure. For example, the command may identify the design parameters data structure by including a pointer or other reference to the design parameters data structure, which has been previously stored. For example, design parameters data structure may include a JSON file listing identifiers of design parameters and corresponding values. In some implementations, the design parameters data structure also includes an indication (e.g., a pointer, a name, or another identifier) that identifies a template integrated circuit design that the design parameters modify. For example, the template integrated circuit design may include modular design data structures that adhere to conventions for facilitating modular design. For example, generating 420 the register-transfer level data structure for the integrated circuit based on the design parameters data structure may include invoking a register-transfer level service (e.g., the register-transfer level service module 130) with data based on the design parameters data structure. For example, the process 600 of FIG. 6 may be implemented to generate 420 a register-transfer level data structure for an integrated circuit based on the design parameters data structure.

For example, the register-transfer level data structure may include one or more Verilog files. The register-transfer level data structure may include updated configuration settings to drive later stages of an integrated circuit design pipeline. In some implementations, the register-transfer level data structure includes a memory map, one or more port assignments, and floorplan information.

The register-transfer level data structure (e.g., a register-transfer level file) may be automatically generated 420 based on the design parameters data structure using tools, such as Scala, Chisel, Diplomacy, and/or FIRRTL. For example, generating 420 the register-transfer level data structure for the integrated circuit may include executing Scala code to read the design parameters data structure and dynamically generate a circuit graph. In some implementations, generating 420 the register-transfer level data structure for the integrated circuit includes invoking a Diplomacy package in Chisel to determine a bus protocol for the integrated circuit.

The process 400 includes, responsive to the command identifying the design parameters data structure, generating 430 a software development kit for the integrated circuit based on the register-transfer level data structure. In some implementations, generating 430 the software development kit for the integrated circuit includes generating loaders for a Verilog simulator and a physical field programmable gate array to be flashed. For example, generating 430 the software development kit may include accessing an existing toolchain or software development kit for a template integrated circuit design that is identified by the design parameters data structure. The existing toolchain or software development kit (e.g., a RISC-V toolchain/SDK) may be set up using conventions suitable for configurability. For example, the existing toolchain or software development kit may be organized into submodules corresponding to design parameters of the design parameters data structure. For example, the software development kit may include a compiler, an assembler, header files, libraries, boot loaders, kernel drivers, and/or other tools for a fully functional SDK/computing environment. For example, generating 430 the software development kit may include executing a Python script. In some implementations, generating 430 the software development kit includes parsing the register-transfer level data structure (e.g., a JSON file), generating options for the tools and builds, generating header files responsive to a memory map, selecting appropriate examples from the existing toolchain or software development kit, generating relevant configuration files for target simulators (e.g., QEMU (Quick Emulator)) so they can run the new design on another processor (e.g., x86), and generating loaders for Verilog simulators and physical FPGA boards to be flashed. The resulting software development kit may be built and tested in the cloud (e.g., before giving to customer). For example, generating 430 the software development kit may include invoking a software development kit service (e.g., the software development kit service module 140) with data based on register-transfer level data structure and/or the design parameters data structure.

The process 400 includes, responsive to the command identifying the design parameters data structure, generating 440 a physical design data structure (e.g., a physical design file) for the integrated circuit based on the register-transfer level data structure. For example, generating 440 a physical design data structure for the integrated circuit may include implementing the process 700 of FIG. 7. For example, generating 440 a physical design data structure for the integrated circuit may include invoking a physical design service (e.g., the physical design service module 160) with data based on register-transfer level data structure and/or the design parameters data structure. For example, generating 440 a physical design data structure for the integrated circuit may include invoking synthesis and place & route tools (e.g., Synopsys, Cadence, and/or Mentor tools). For example, generating 440 a physical design data structure for the integrated circuit may include performing logical equivalent checking. For example, generating 440 a physical design data structure for the integrated circuit may include invoking static timing analysis tools. For example, generating 440 a physical design data structure for the integrated circuit may include performing design rule checking (DRC) and/or layout versus schematic (LVS) checking. For example, generating 440 a physical design data structure for the integrated circuit may include determining power, performance, and area estimates for the resulting integrated circuit design and providing these estimates as feedback to a user (e.g., a user of the web client 102). For example, the physical design data structure may include in less-technical terms whether there are any issues with the physical design. For example, the physical design data structure may highlight important components of the output of the synthesis and place & route tools. For example, the physical design data structure may include a GDSII file or an OASIS file. For example, generating 440 a physical design data structure for the integrated circuit may include managing and orchestrating physical design toolchains in a cloud. For example, generating 440 a physical design data structure for the integrated circuit may include handling database movement from tool to tool, and managing access to third party IP cores. For example, generating 440 a physical design data structure for the integrated circuit may include accessing template designs, which may allow for significant design reuse. For example, generating 440 a physical design data structure for the integrated circuit may include identifying those combinations to reduce workload. For example, generating 440 a physical design data structure for the integrated circuit may provide better or more compact error/issue reporting, by translating tool issues into manageable feedback and providing the actual error/output of tools in a deliverable format to a user (e.g., a user of the web client 102). For example, generating 440 a physical design data structure for the integrated circuit may include using physical design blocks for identified pairings of functional blocks that may be reused across designs to improve efficiency.

The process 400 includes, responsive to the command identifying the design parameters data structure, generating 450 documentation for the integrated circuit based on the register-transfer level data structure. For example, generating 450 documentation for the integrated circuit may include using Prince (available at https://www.princexml.com/). For example, generating 450 documentation for the integrated circuit may include using ASCII Doc (available at http://asciidoc.org/). For example, generating 450 documentation for the integrated circuit may include accessing a pre-loaded modular manual for a template integrated circuit design that is identified by the design parameters data structure. The modular manual may be set up using conventions suitable for configurability. For example, the modular manual may be organized into submodules corresponding to design parameters of the design parameters data structure. In some implementations, the modular manual is stored as multiple components in corresponding directories of an existing SDK for the template. Generating 450 documentation for the integrated circuit may include generalizing the pre-loaded modular manual to respond to values of design parameters in the design parameters data structure. For example, the generated 450 documentation may be in an HTML format and/or in a PDF format. In order to correctly document the memory map/ports, generating 450 documentation for the integrated circuit may include working with the post-RTL output. For example, generating 450 documentation for the integrated circuit may include utilizing a documentation framework similar to the React framework (e.g., a JS HTML framework). In some implementations, documentation blocks have a respective piece of python code that takes in an RTL output configuration file and breaks it down into the chunks that ASCII Doc requires and invokes content generation. For example, generating 450 documentation for the integrated circuit may include implementing the process 800 of FIG. 8. For example, generating 450 documentation for the integrated circuit may include invoking a documentation service (e.g., the documentation service module 150) with data based on register-transfer level data structure and/or the design parameters data structure.

The process 400 includes, responsive to the command identifying the design parameters data structure, generating 460 a field programmable gate array emulation data structure (e.g., a field programmable gate array emulation file) for the integrated circuit based on the register-transfer level data structure and the software development kit. For example, the field programmable gate array emulation data structure for the integrated circuit may be configured to utilize a cloud based field programmable gate array (FPGA). For example, generating 460 a field programmable gate array emulation data structure for the integrated circuit may include invoking a cloud based FPGA synthesis tool. For example, generating 460 a field programmable gate array emulation data structure for the integrated circuit may include invoking emulation platforms, such as, Palladium (from Cadence), Veloce (from Mentor Graphics), and/or Zebu (from Synopsys). For example, the field programmable gate array emulation data structure for the integrated circuit may be configured to handle emulating devices hard drives and network devices. For example, the field programmable gate array emulation data structure may include an emulation file and supporting materials. In some implementations, the field programmable gate array emulation data structure for the integrated circuit may provide for emulation of a whole system, including peripherals, operating together (e.g., memory timing needs to be matched). For example, the peripherals emulated may be the actual peripherals a user has selected in the web interface generated by the web application server 112. For example, generating 460 a field programmable gate array emulation data structure for the integrated circuit may include highly detailed use of existing tools based on the parameterized integrated circuit design. For example, generating 460 a field programmable gate array emulation data structure for the integrated circuit may include invoking the FPGA/Emulator toolchain, setting up the emulated devices, and compiling the emulated devices. For example, generating 460 a field programmable gate array emulation data structure for the integrated circuit may include invoking a FPGA/emulation service (e.g., the field programmable gate array design service module 170) with data based on register-transfer level data structure and/or the design parameters data structure.

The process 400 includes, responsive to the command identifying the design parameters data structure, generating 470 a test plan for an integrated circuit based on the design parameters data structure and acceptance criteria. In some implementations, the acceptance criteria are received with the design parameters data structure (e.g., received from the web client 102 or received from the scripting API client 104). In some implementations, the acceptance criteria are read from memory (e.g., the memory 306). For example, generating 470 a test plan for an integrated circuit may include invoking Verilog simulators (e.g., open source Verilog simulators). For example, the test plan for an integrated circuit may include utilizing FPGAs. For example, the test plan for an integrated circuit may include utilizing software simulators, such as Quick Emulator (QEMU), Spike, and/or other software simulators. In some implementations, multiple target test platforms look the same so the test plan for an integrated circuit may include moving the workloads across different cost options (e.g., using physical FPGAs vs. cheaper using pre-emptible cloud instances). For example, a test plan for an integrated circuit may be generated 470 based on the register-transfer level data structure (e.g., including Verilog RTL), the software development kit, the physical design data structure (e.g., including a GDSII file), a corpus of tests, and corresponding acceptance criteria. In some implementations, generating 470 a test plan for an integrated circuit may include responding to varying acceptance criteria that are user-defined. Given acceptance criteria and a design configuration, a test plan may be generated 470 automatically. For example, generating 470 a test plan for an integrated circuit may include defining environments, filtering out tests that cannot be run given a corpus of tests and a hardware and software design generated based on the design parameters data structure, and generating the test plan to include a sequence of selected tests for the integrated circuit design. For example, an environment may define a test platform. There may be additional components in a test bench, outside the device under test, and it may be beneficial to standardize these environments across designs. For example, a way to end a test may be standardized within a test platform. Some test platforms may define a register a CPU can write to that is defined within the test bench, while some test platforms will wiggle a general purpose input/output (GPIO) pin in a certain way. Given a test plan, many test platforms may be used for all tests.

The process 400 includes, responsive to the command identifying the design parameters data structure, invoking 480 tests for the integrated circuit based on the test plan, the register-transfer level data structure, the software development kit, and the physical design data structure to obtain a set of test results. For example, the invoked 480 verification tests may be executed directly by a controller (e.g., the controller 120), by a verification service (e.g., the verification service module 180), and/or by an external service (e.g., a cloud based FPGA or emulation service that is accessed via communications over a network). In some implementations, invoking 480 tests for the integrated circuit may include invoking a test using a field programmable gate array, programmed based on the field programmable gate array emulation data structure, to obtain an emulation result. The field programmable gate array may be operating on a cloud server. For example, invoking 480 tests for the integrated circuit may include using credentials (e.g., a login and/or password) to invoke the test on the field programmable gate array operating on a cloud server. For example, the test results may include summary information for a large number of tests, such as a binary indication of whether all acceptance criteria were met by the generated integrated circuit design, or a list of binary indications of whether individual verification tests were passed for respective verification tests included in the test plan.

The process 400 includes transmitting, storing, or displaying 490 a design data structure based on the register-transfer level data structure, the software development kit, the physical design data structure, and the test results. For example, the design data structure may be a collection of files, an archive, or a repository (e.g., a GitHub repository) that includes data from the register-transfer level data structure, the software development kit, the physical design data structure, and the test results. For example, the design data structure may also include the documentation generated 450 and/or the field programmable gate array emulation data structure generated 460. For example, the design data structure may be transmitted 490 to an external device (e.g., a personal computing device) for display or storage. For example, the design data structure may be stored 490 in memory (e.g., the memory 306). For example, design data structure may be displayed 490 in a user interface (e.g., the user interface 320). For example, the design data structure may be transmitted 490 via a network communications interface (e.g., the network communications interface 318).

Although the process 400 is shown as a series of operations for clarity, implementations of the process 400 or any other technique, process, or algorithm described in connection with the implementations disclosed herein can be performed in various orders or concurrently. Additionally, operations in accordance with this disclosure can be performed with other operations not presented and described herein. For example, the process 500 of FIG. 5 may be used to iterate the process 400 with varying design parameters to search a design space. Furthermore, one or more aspects of the systems and techniques described herein can be omitted. For example, operation 450 may be omitted from the process 400.

Figure 5:
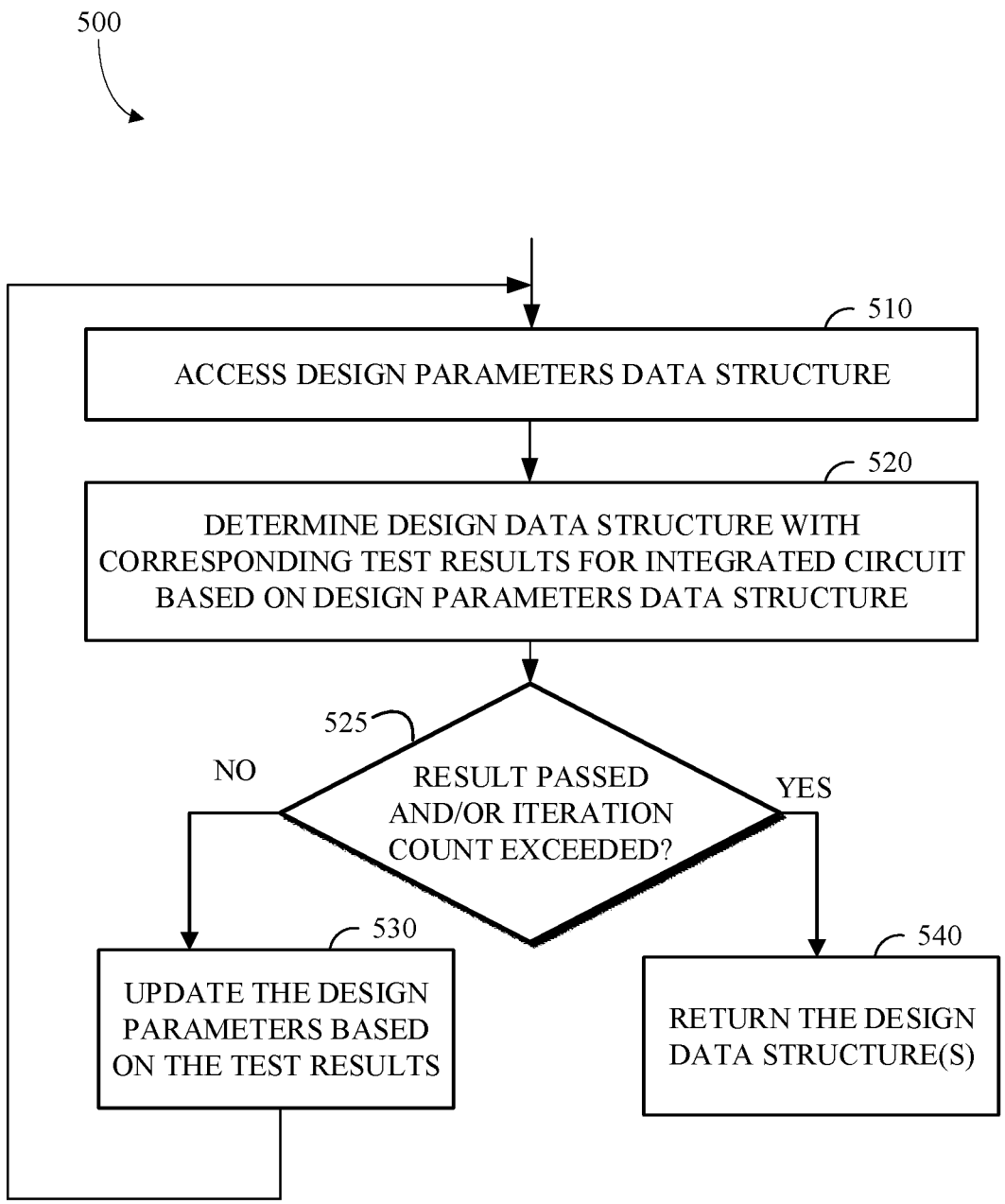
FIG. 5 is flow chart of an example of an iterative process for facilitating design of integrated circuits.

FIG. 5 is flow chart of an example of an iterative process 500 for facilitating design of integrated circuits. The process 500 includes accessing 510 a design parameters data structure (e.g., as described in relation to operation 410 of FIG. 4); determining 520 (e.g., using the process 400 of FIG. 4) a design data structure with corresponding test results for an integrated circuit based on the design parameters data structure; if (at operation 525) the test results failed (e.g., the test results did not meet a set of acceptance criteria) and/or an iteration count is not exceeded, then updating 530 the design parameters data structure based on the test results and proceed to a next iteration; and if (at operation 525) the test results passed (e.g., the test results met a set of acceptance criteria) and/or an iteration count is exceeded, then returning 540 the one or more design data structures that were determined 520. In some implementations, all design data structures determined 520 with their corresponding test results are returned 540 when the process 500 terminates. In some implementations, only a last design data structure determined 520 with its corresponding test results is returned 540 when the process 500 terminates with a passing test result. In some implementations, the acceptance criteria used to determine whether an integrated circuit design has passed may include constraints on power, performance, and/or area for a physical design. For example, while being invoked to produce a chip that meets a certain performance benchmark while staying under a certain area/power consumption constraint that has not yet been met (e.g., not fast enough or too big or power hungry), design parameter values may be updated 530 in a direction that seeks towards closer fit to requirements. For example, the process 500 may be implemented using the scripting API of the controller 120. For example, the process 500 may be implemented by the integrated circuit design service infrastructure 110. For example, the process 500 may be implemented by the system 100 of FIG. 1. For example, the process 500 may be implemented by the system 300 of FIG. 3.

Figure 6:
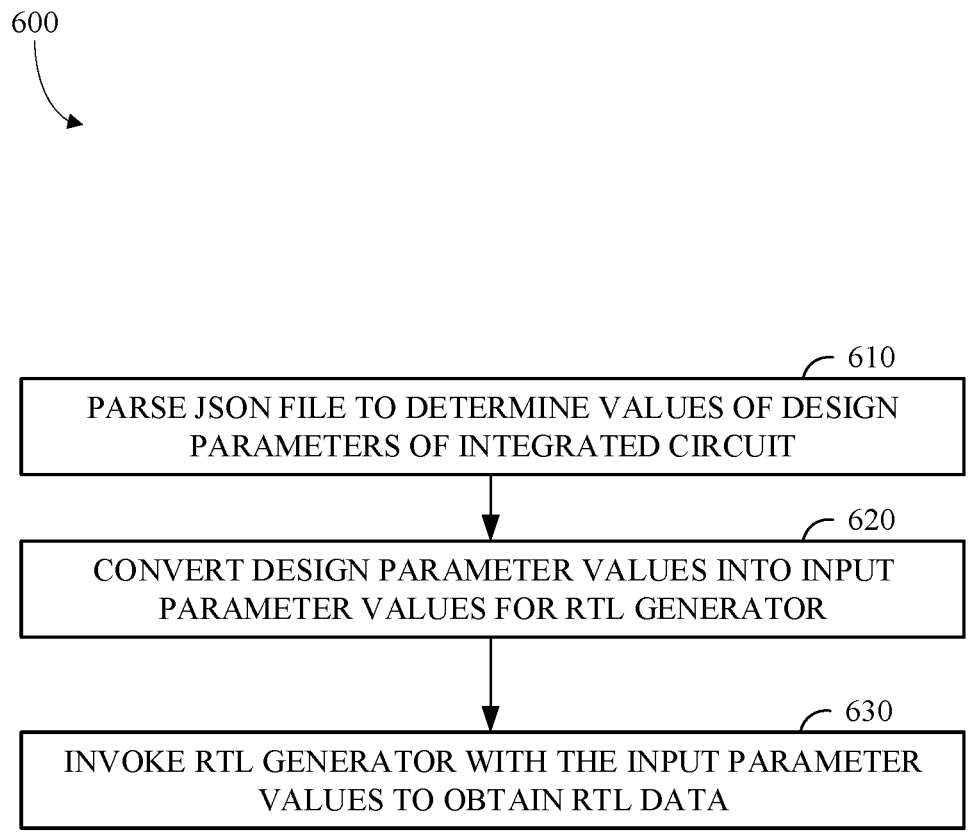
FIG. 6 is flow chart of an example of a process for generating a register-transfer level data structure for an integrated circuit based on a design parameters data structure.

FIG. 6 is flow chart of an example of a process 600 for generating a register-transfer level data structure for an integrated circuit based on a design parameters data structure. For example, the design parameters data structure may include a JSON file. For example, the design parameters data structure may include design parameter values determined by a user using configuration knobs in a web interface (e.g., design knobs of the configuration pane 1220 of FIG. 12) and/or values associated with a template integrated circuit design. The process 600 includes parsing 610 the JSON file to determine the values of the design parameters of the integrated circuit design; converting 620 the design parameter values into input parameter values for an register-transfer level generator; and invoking 630 the register-transfer level generator with the input parameters to obtain register-transfer level data included in the register-transfer level data structure. For example, the register-transfer level generator may include tools, such as Scala, Chisel, Diplomacy, and/or FIRRTL. For example, the process 600 may be implemented by the integrated circuit design service infrastructure 110. For example, the process 600 may be implemented by the system 100 of FIG. 1. For example, the process 600 may be implemented by the system 300 of FIG. 3.

The process 600 includes invoking 630 the register-transfer level generator with the input parameters to obtain register-transfer level data included in the register-transfer level data structure. For example, the register-transfer level generator may be a Scala program encoded in Chisel. For example, invoking 630 the register-transfer level generator may include executing Scala code to dynamically generate a circuit graph. For example, invoking 630 the register-transfer level generator may include using Chisel to generate FIRRTL based on the circuit graph. FIRRTL is an intermediate representation for the integrated circuit. For example, invoking 630 the register-transfer level generator may include invoking a FIRRTL compiler to optimize the design. For example, invoking 630 the register-transfer level generator may include invoking a FIRRTL Verilog backend invoked to output Verilog. For example, the register-transfer level data structure may include one or more Verilog files. In some implementations, the register-transfer level data structure includes a memory map, one or more port assignments, clock, floorplan information, and/or other design configuration data. For example, a clock may be specified in the register-transfer level data structure as both a netlist for the clock circuit (e.g., the RTL generator may instantiate the clocking circuits, such as PLLs and clock dividers) and a description of the clocking circuit so that it can be used within the downstream services or tools. For example, input to the RTL generator could be specified at a high level such as "add a 64-bit DDR controller". The RTL generator may access and utilize default design parameters such as "this DDR controller is a Cadence controller with 8-bit ECC, 32-entry re-order buffer."

Figure 7:
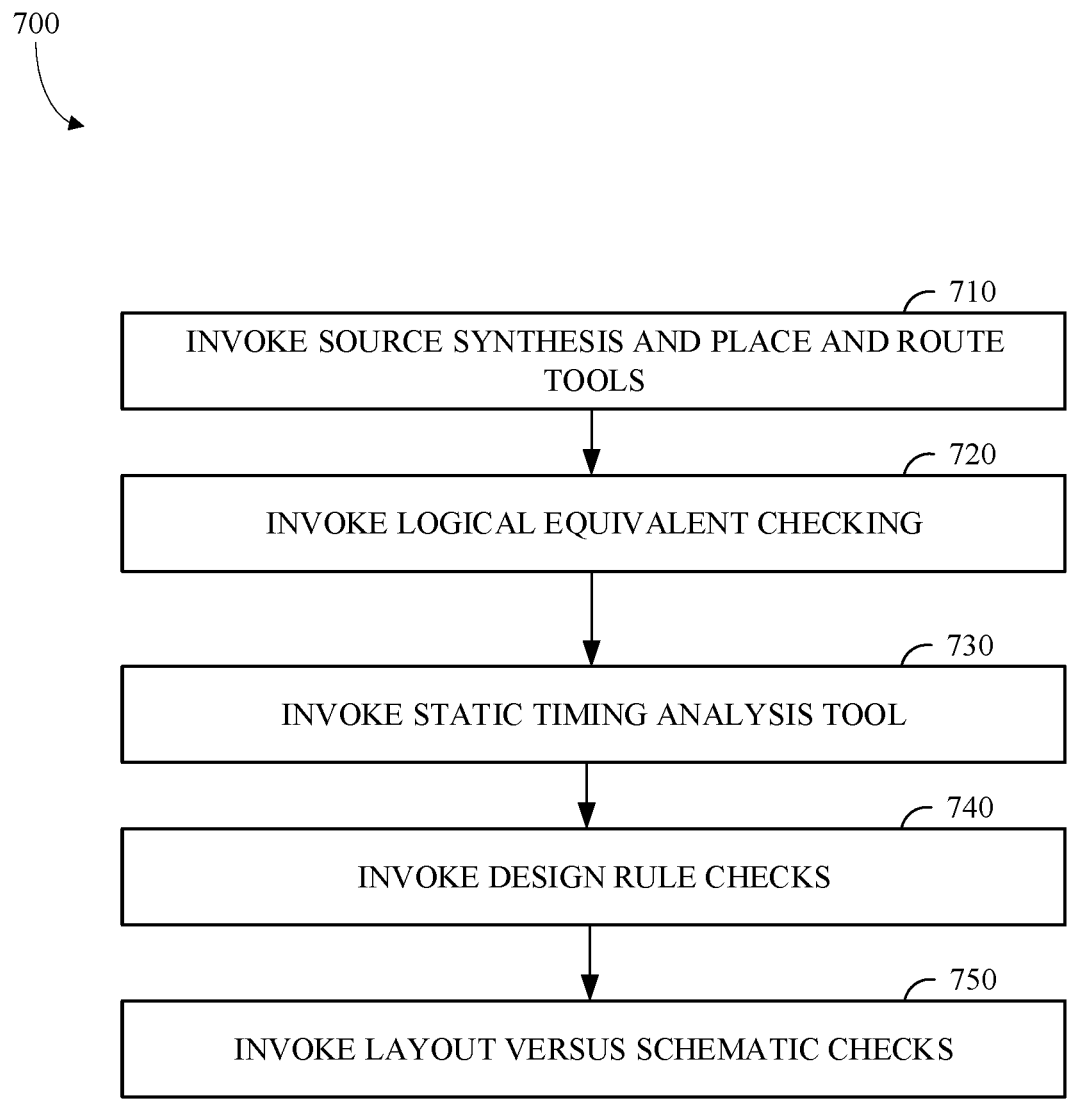
FIG. 7 is flow chart of an example of a process for generating a physical design data structure for an integrated circuit based on a register-transfer level data structure.

FIG. 7 is flow chart of an example of a process 700 for generating a physical design data structure for an integrated circuit based on a register-transfer level data structure. The process 700 includes invoking 710 source synthesis and place and route tools; invoking 720 logical equivalent checking; invoking 730 a static timing analysis tool; invoking 740 design rule checks; and invoking 750 layout versus schematic checks. For example, example the tool chains invoked may include Synopsys tools, such as Design Compiler, IC Compiler, PrimeTime, Formality, and/or StarExtract. In some implementations, invoking 710 source synthesis and place and route tools includes managing and orchestrating physical design toolchains in a cloud. In some implementations, invoking 710 source synthesis and place and route tools includes executing physical design tool chains that are installed locally on a same computing device. For example, the process 700 may be implemented by the integrated circuit design service infrastructure 110. For example, the process 700 may be implemented by the system 100 of FIG. 1. For example, the process 700 may be implemented by the system 300 of FIG. 3.

Figure 8:
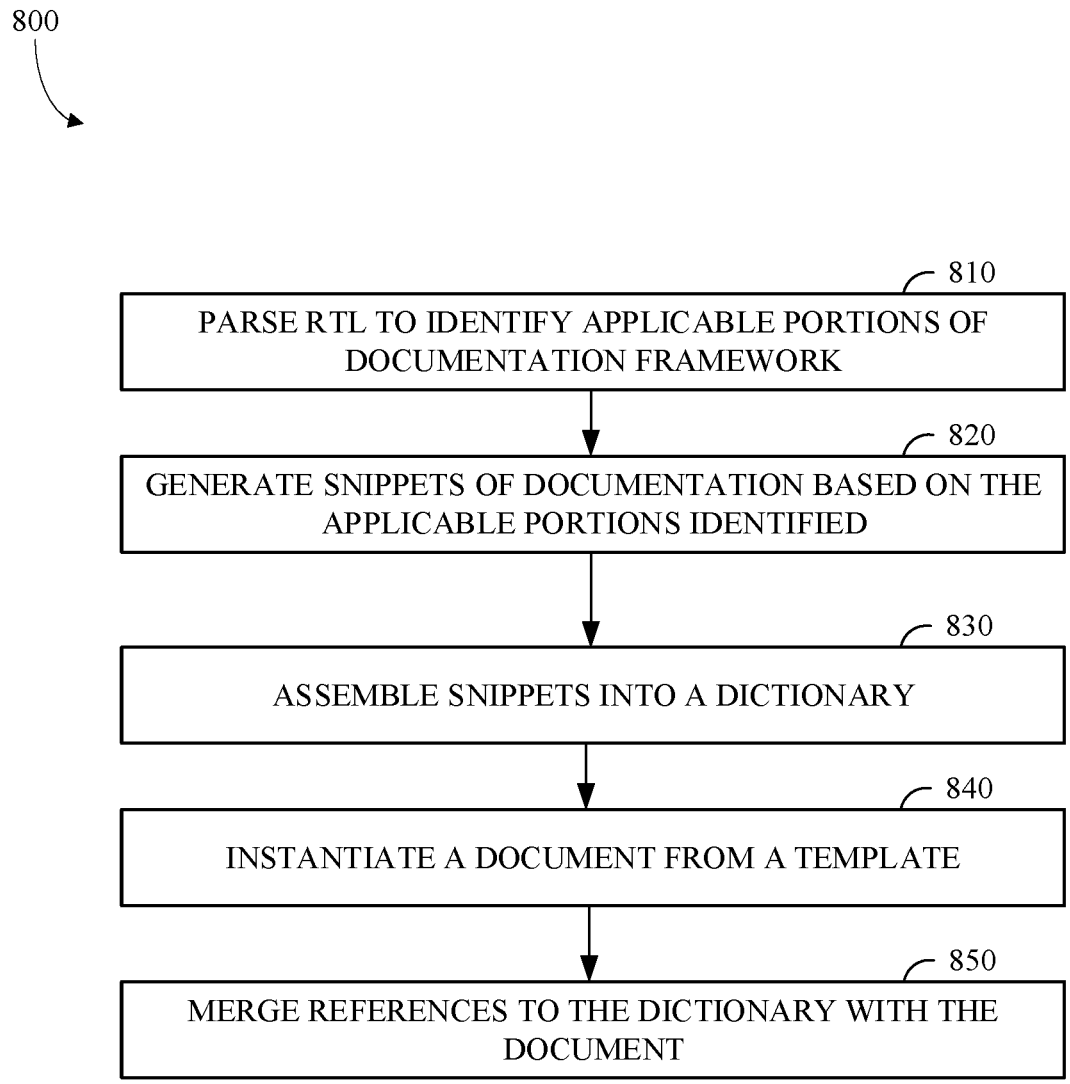
FIG. 8 is flow chart of an example of a process for generating documentation for an integrated circuit based on a register-transfer level data structure.

FIG. 8 is flow chart of an example of a process 800 for generating documentation for an integrated circuit based on a register-transfer level data structure. The process 800 includes parsing 810 (e.g., using Python code) the register-transfer level data structure for the integrated circuit to identify applicable portions of a documentation framework;

generating 820 snippets of documentation based on the applicable portions identified; assembling 830 the snippets into a dictionary; instantiating 840 a document from a template (e.g., a ASCII Doc template); and merging 850 references to the dictionary with the document. For example, the documentation framework may be similar to the React framework. In some implementations, chapters or sections may be added dynamically to the document. For example, chapter and section headings with numbering may be generated dynamically. For example, IP core documentation (e.g., 3$^{rd}$ party IP core documentation) may be being pulled in to documentation for a system-on-a-chip design that includes the IP core. For example, the process 800 may be implemented by the integrated circuit design service infrastructure 110. For example, the process 800 may be implemented by the system 100 of FIG. 1. For example, the process 800 may be implemented by the system 300 of FIG. 3.

Figure 9:
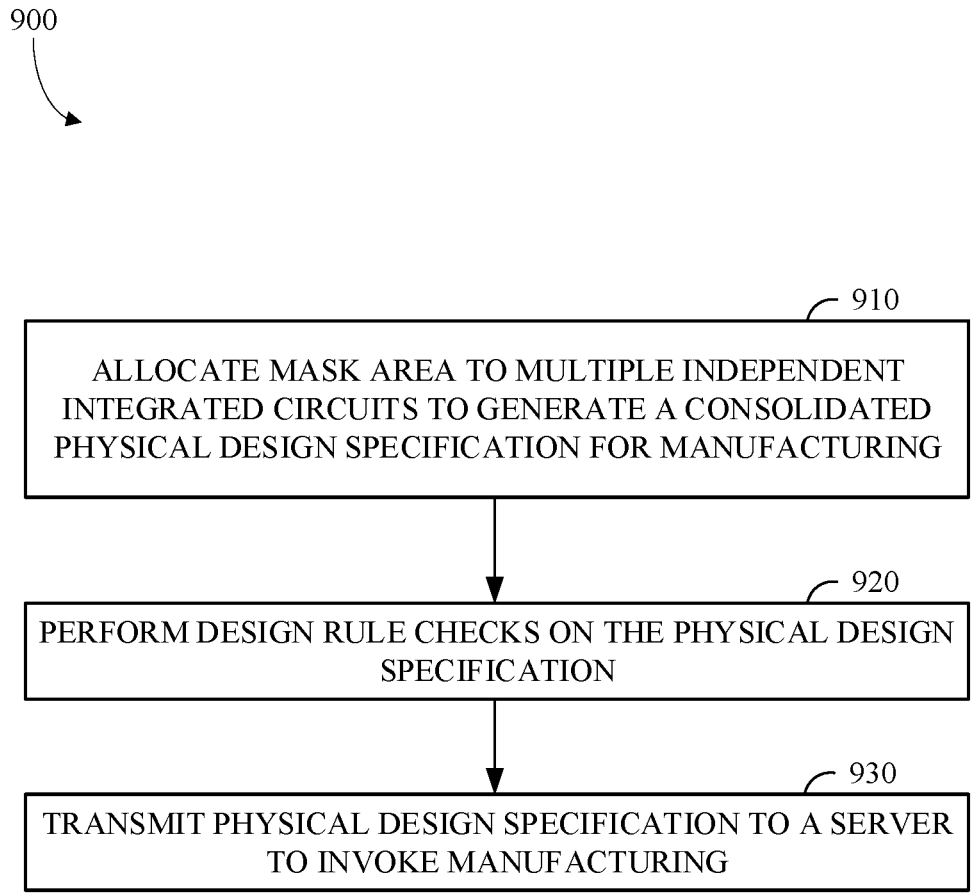
FIG. 9 is flow chart of an example of a process for generating a multi-tenant physical design specification to facilitate manufacturing of integrated circuits.

FIG. 9 is flow chart of an example of a process 900 for generating a multi-tenant physical design specification to facilitate manufacturing of integrated circuits. For example, the physical design specification may include designs for multiple independent integrated circuits. The process 900 may include allocating 910 mask area to the multiple independent integrated circuits based on a production plan; performing 920 design rule checks on the physical design specification; and transmitting 930 the physical design specification to a server to invoke manufacturing. For example, the process 900 may be implemented by the integrated circuit design service infrastructure 110. For example, the process 900 may be implemented by the system 100 of FIG. 1. For example, the process 900 may be implemented by the system 300 of FIG. 3.

The process 900 includes allocating 910 mask area to the multiple independent integrated circuits based on a production plan. For example, the multiple independent integrated circuits may be gathered as finished physical design data structures (e.g., GDSII files or OASIS files). In some implementations, the multiple independent integrated circuits are gathered from multiple users in a multi-tenant environment. A reticle plan may be built given a specification of how many chips are requested for each of the multiple integrated circuits. For example, if there are User A—Chip 1, User B—Chip 2, and User B—Chip 3. And you want 50% Chip 1 and 25% 2 and 25% 3, the mask area may be allocated 910 accordingly.

The process 900 includes performing 920 design rule checks on the physical design specification. The physical design specification for the mask, which includes copies of the multiple independent integrated circuits, may be checked for design rule violations (e.g., to check for spacing violations between copies of the multiple independent integrated circuits). Performing 920 this top level DRC checking may serve as a final check of the deck that will be sent to the foundry for fabrication.

The process 900 includes transmitting 930 the physical design specification (e.g., a GDSII file or an OASIS file) to a server to invoke manufacturing. Transmitting 930 the physical design specification may constitute submission of a tape out form to a foundry (e.g., via a web service/API) to the fab and API. For example, the physical design specification may be transmitted 930 to a server associated with a foundry (e.g., the manufacturer server 230). The foundry may then manufacture the multiple independent integrated circuits using the physical design specification in response to receiving the physical design specification. For example, the physical design specification may be transmitted 930 via a network communications interface (e.g., the network communications interface 318).

Figure 10:
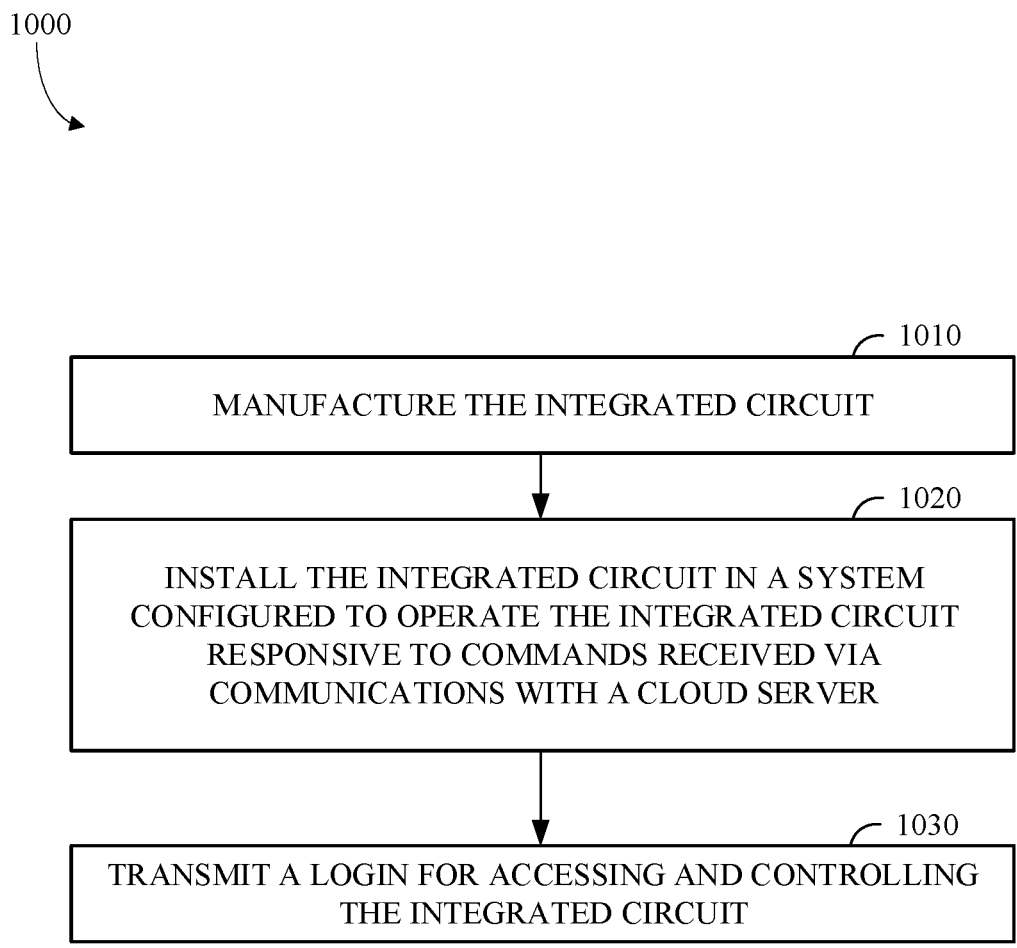
FIG. 10 is flow chart of an example of a process for facilitating manufacturing and testing of integrated circuits.

FIG. 10 is flow chart of an example of a process 1000 for facilitating manufacturing and testing of integrated circuits. In some implementations, manufacturing facilities may be included in an integrated circuit design service infrastructure and used to manufacture integrated circuits (e.g., chips) at the request of a user. For example, although not shown in FIG. 1, the integrated circuit design service infrastructure 110 may include a chip manufacturing service (e.g., an automated fabrication facility). The process 1000 includes manufacturing 1010 the integrated circuit; installing 1020 the integrated circuit in a system configured to operate the integrated circuit responsive to commands received via communications with a cloud server; and transmitting 1030 a login for accessing and controlling the integrated circuit. For example, the login may be transmitted 1030 via a network communications interface (e.g., the network communications interface 318) from the controller 120 to a user that requested the manufacture if the integrated circuit (e.g., transmitted 1030 via the web application server 112 to the web client 102). Using the process 1000 may enable a user to quickly and conveniently run or test instances of their new integrated circuit from a remote location.

Figure 11:
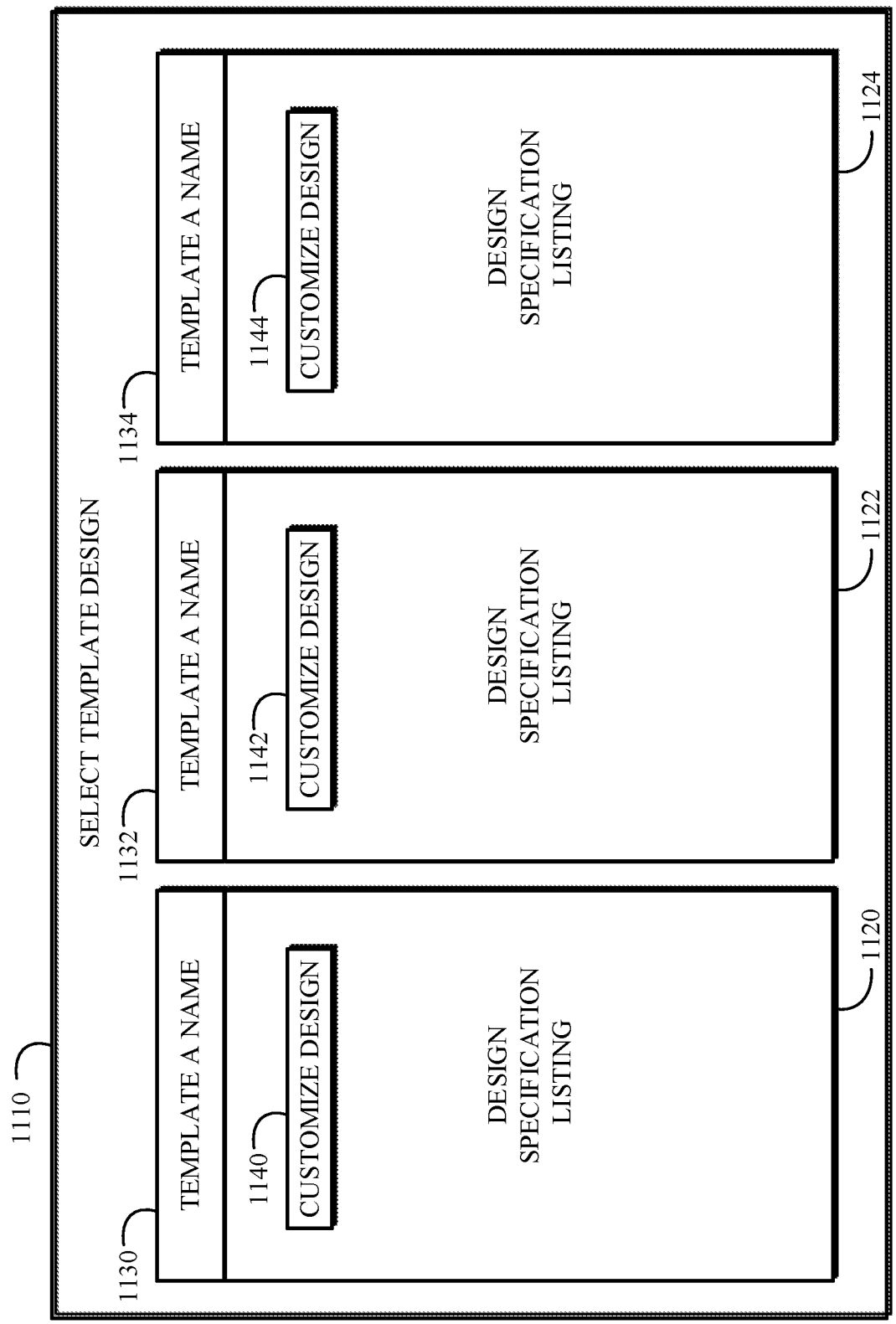
FIG. 11 is a diagram of an example display region generated for presenting a web interface to facilitate selection of a template design of an integrated circuit.

FIG. 11 is a diagram of an example display region 1110 generated for presenting a web interface to facilitate selection of a template design of an integrated circuit. The display region 1010 may display a list of design templates (e.g., for an IP core) that may be selected for inclusion and/or customization in an integrated circuit design. For each available design template, a design specification listing (1120, 1122, and 1124) is displayed, showing some key features and/or design parameters of the respective design template. Each design specification listing (1120, 1122, and 1124) has a template name (1130, 1132, and 1134) at the top that identifies the design template. Each design specification listing (1120, 1122, and 1124) has a customize design icon (1140, 1142, and 1144) that enables a user to select the respective template design for customization and design development.

Figure 12:
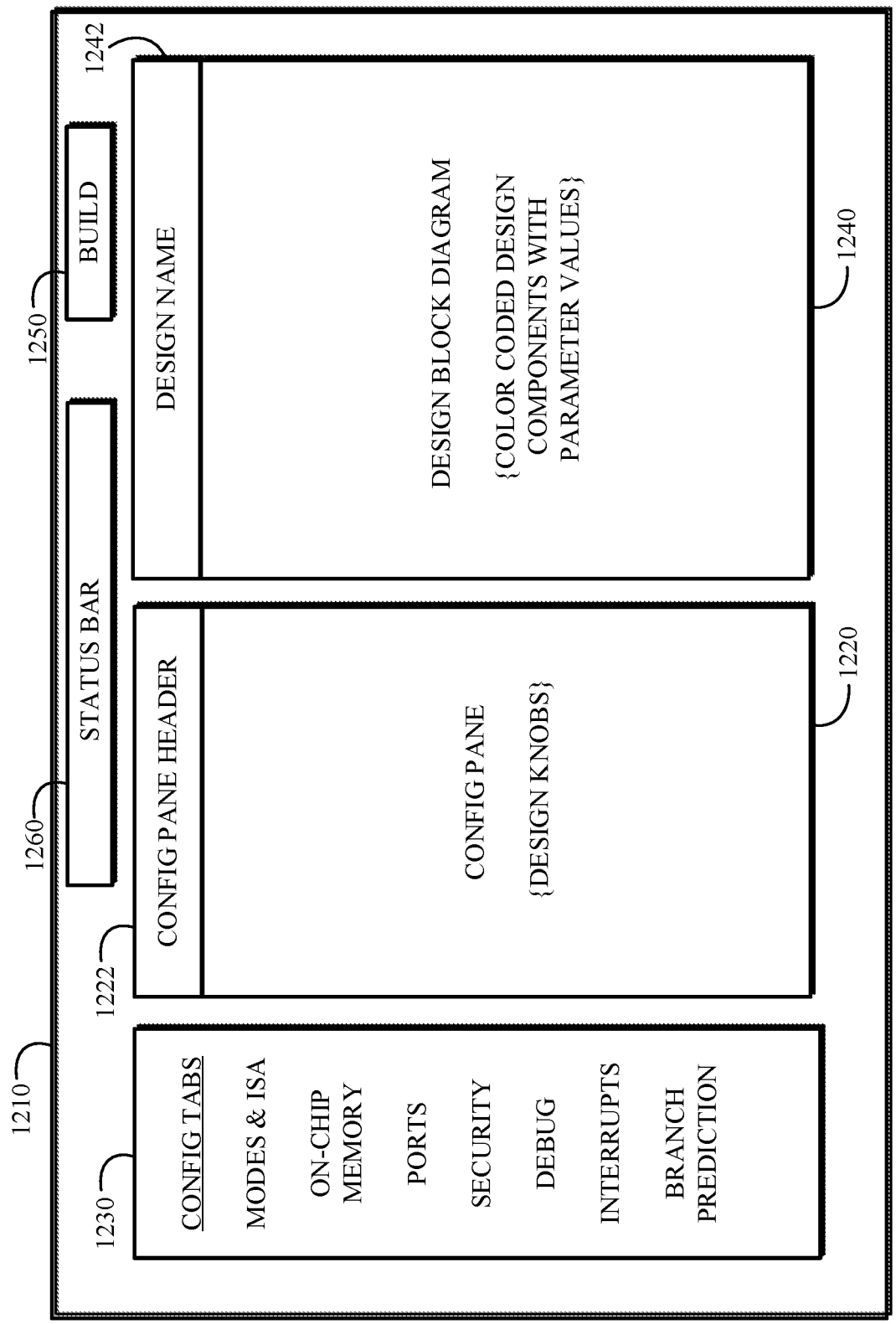
FIG. 12 is a diagram of an example display region generated for presenting a web interface to facilitate customized design of an integrated circuit.

FIG. 12 is a diagram of an example display region 1210 generated for presenting a web interface to facilitate customized design of an integrated circuit. The display region 1210 includes a configuration pane 1220 that includes design knobs that can used to select values of design parameters for an integrated circuit design, and has a configuration pane header 1222 that shows the name of a currently displayed category of design knobs. The display region 1210 includes a configuration tabs menu 1230 that includes icons that allow a user to select a category of design knobs to be displayed in the configuration pane 1220 and available for adjustment by the user. For example, the categories of design knobs may include modes & ISA, on-chip memory, ports, security, debug, interrupts, and branch prediction. The design knobs may provide a way of displaying the design parameter values in a design parameter data structure visually and summarizing. The design knobs may facilitate easy changes to design parameter values. In some implementations, the design knobs may be updated in real-time to reflect dependencies between different design parameters by disabling or constraining the values of one design parameter based on another.

The display region 1210 includes a design block diagram 1240 that displays summary current values design parameter values that may be selected using the design knobs of the configuration pane 1220. The design block diagram 1240 includes a design name 1242 that identifies the current integrated circuit design. For example, the design block diagram 1240 may use color coding to reflect the presence or absence of certain features and text reflecting the values of other design parameter for an integrated circuit design. For example, the design block diagram 1240 may be an auto-updating block diagram that is updated in real-time to reflect changes in the design parameter values as they are made using the design knobs. In some implementations, a design parameters data structure is generated based on input received via a web application that displays an auto-updating block diagram 1240 of a template design reflecting changes to values of the design parameters of the integrated circuit. In some implementations, the design block diagram 1240 may display estimates of power, performance and area for an integrated circuit design based on the currently selected design parameter values. For example, the PPA (power performance area) estimates may be updated instantly in real-time in response to changes made to the design parameter values using the design knobs. This feature may provide direct feedback on how chip will perform as design changes are made.

The display region 1210 includes a build icon 1250 that may be used to issue a command to build and test and integrated circuit design based on the design parameter values selected with the design knobs and/or reflected in the design block diagram. For example, the current design parameter values when the build command is issued may be encoded in design parameters data structure (e.g., a JSON file) that is accessed by the controller 120 to start the The display region 1210 includes a status bar 1260 that indicates a current status of the design (e.g., design, review, or building). For example, the display region 1010 may be generated (e.g., by the web application server 112) using Python and/or Django front ended tools.

Figure 13:
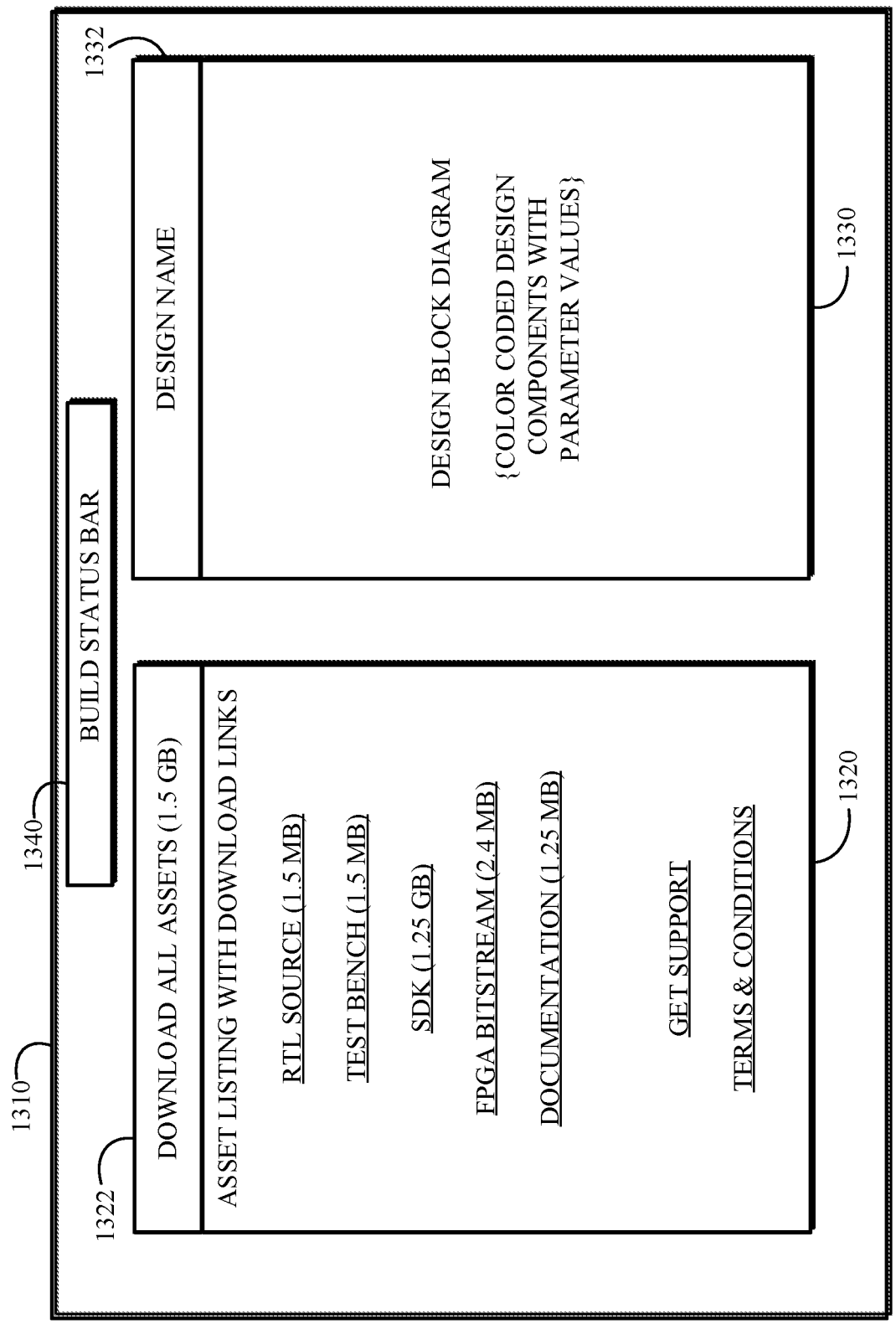
FIG. 13 is a diagram of an example display region generated for presenting a web interface to facilitate access to a customized design of an integrated circuit.

FIG. 13 is a diagram of an example display region 1310 generated for presenting a web interface to facilitate access to a customized design of an integrated circuit. For example, the display region 1310 may display after a build operation is completed by the system, resulting in a design data structure that includes a set of files encoding the generated integrated circuit design and associated test results. The display region 1310 includes an asset listing 1320 with download links. The links of the asset listing 1320 enable the download (e.g., at the web client 102) of files of the design data structure, such as an RTL source file, a test beach file, a software development kit, an FPGA bitstream, and documentation for the resulting integrated circuit design. The asset listing 1320 also includes a download all assets link 1322 that enables the download of an archive or repository including all the files of the design data structure.

The display region 1310 includes a design block diagram 1330 (e.g., the same as or similar to the design block diagram 1240 of FIG. 12) that displays easy to read indications of the design parameter values used for the integrated circuit design. The design block diagram 1330 includes a design name 1332 displaying an identifier for the integrated circuit design.

The display region 1310 includes a build status bar 1340 that reflects a date and time when the build of the integrated circuit design was completed. Before the build is completed, the build status bar 1340 may reflect a current status of the ongoing build process running in the integrated circuit design service infrastructure 110.

PROMETHEUS—An Example of a System for Automated Design Flow Generation

What is Prometheus: Prometheus may include a custom electronic design automation (EDA) tool like methodology engine whose purpose is to drive all flow and design development. In general, Prometheus centers around the following philosophies: easy to learn and use; self-documenting; correct-by-construction; scalable and massively collaborative; controllability, consistency, and predictability in quality and effort; and ease of automation.

Prometheus Implementation: Prometheus may be built with the Ruby scripting language, with a full Tcl user interface. Tcl (Tool Control Language) is a widely used language among chip designers and may be the de-facto control language for EDA tools. As a programming language Tcl has limitations as it is mostly used for EDA tool control, rather than complicated algorithms and sophisticated tasks. Ruby is an object oriented, interpreted language with an interactive shell and package manager called RubyGems. Ruby is a powerful scripting language, but few integrated circuit designers are conversant with Ruby or similar languages. As such, there is a steep learning curve. By combining the power of both, with Tcl on top of Ruby, the best of both worlds may be realized. An implementation using Tcl on top of Ruby may provide many benefits and features. For example, a chip designer can utilize Prometheus effectively while only knowing Tcl. Users of mainstream EDA tools may find Prometheus usage to be very much similar and familiar to most mainstream EDA tools, thus reducing the user learning curve. Users that have experience with modern EDA tool suite should be quite able to utilize Prometheus without much learning hurdle. In the Prometheus system, Ruby may be reserved for developers, who are more advanced users and savvier programmers. Prometheus may provide full Tcl support, while also being easily extensible via Ruby. For example, a user can extend basic Tcl commands and features using the much more powerful Ruby language. The Prometheus Tcl interface may be a much more powerful and useable Tcl shell compared to existing Tcl shells like tclsh. Examples include history manager, command and file auto-complete features, display auto-wrap features, nested-block indicator in command prompt, etc., all managed and enabled via Ruby. Incorporating Ruby may also enable Prometheus to provide better debug and exception handling, etc. A Tcl interactive shell is widely used in EDA. Having a Ruby interactive shell on top of Tcl interactive shell means a user can switch between Tcl and Ruby shells easily, which may facilitate in-situ development and debugging; and allow for line-by-line execution for both Tcl as well as Ruby scripts, which is very important feature during development.

Having an interpreted language such as Ruby as the base language means Prometheus source code may be updated dynamically. Systems or services may be further enabled for machine learning, meta programming, and self-generating code. For example, the system 1600 of FIG. 16 may be used to iteratively update a design flow used to generate an integrated circuit design. For example, the process 1700 of FIG. 17 may be implemented to iteratively update a design flow used to generate an integrated circuit design.

A system similar to Prometheus may be built with alternative scripting/interpreted and object oriented languages. For example, a similar system may be built with Tcl on top of Python.

Prometheus may provide many features. Part of the Prometheus framework is its ability to support many modes of operations. These modes may be completely independent or also coexist with other modes. These modes may be modular and extensible. For example, modes may provide an interface to main features of tools. Examples of modes include: Release mode; Design mode; HTML mode; Graph mode; Flow mode; Setup mode; Flowmodule mode; Template mode. Some notable modes are described in more detail herein.

Release mode is a mode where Prometheus acts as an application programming interface (API) for releases. A user may be enabled to codify or script file and directory rules, patterns, structure, convention, etc. for releases. Release manager may manage a two-step release process: (1) a local build step, in which files (e.g., all files to be released) are checked and made available at local release directory prior to release commitment. (2) a commit step, in which, once committed, release is made to specified location where it is permission/revision controlled. Prometheus may handles version, location, revision, etc. automatically. Prometheus may provide extensive build report vs prior releases, including statistics on added files, changed files, removed files, etc.; and a time stamp/file diff checker. Prometheus may provide a built-in release conflict manager to prevent multiple users from making the same release.

Design mode is a mode where Prometheus allows users to create Verilog designs, and may incorporate the following parsers: Liberty parser; Verilog parser; Library Exchange Format (LEF) parser; Spice parser; and Graphic Database System (GDS) parser. For example, users can use design mode to parameterize and generate designs that cannot be codified or described in behavioral RTL. An example is implementation IPs, which may include: glitch-less clock mux; on-chip clock generator; a process monitor; delay chains/lines (used in DLLs, Flash, etc.); dividers and counters; among other things. Design mode may allow users to create, parameterize, instantiate, and connect design modules and generate a top level RTL. It can also facilitate the automatic generation of a simulation testbench wrapper.

Flow mode is a mode where Prometheus enables users to automatically generate complex flow management files (e.g., MakePP makefiles), for example, by describing a graph based nodal directed acyclic graph (DAG). Conventional approach requires codification of GNU Makefiles, which may be difficult to read, manage, and modify even for those well-experienced with Makefiles. Prometheus users may describe tasks in terms of nodes in a DAG and flow relationship between them as edges. A flow management file may be automatically generated by Prometheus. A flow can be fully hierarchical and recursive. Tasks can be declared as dependent or independent in its execution nature, and normal, hierarchical, and flowmodule as its type.

Flowmodule mode allows for the creation of tasks that have well defined interface, but very complex, highly configurable and parameterizable internal tasks. An example of a flowmodule could be a synthesis task, a design for test (DFT) task, place-and-route task, etc. The Flowmodule mode allows users to describe the interface, setting, configuration, file and directory structure, sub-flow structure of a complex task. Once defined, flowmodules may be invoked, instantiated, and configured through flow mode. This may enable flow abstraction without compromising its controllability and programmability.

Graph mode illustrates one example where any seemingly random language (such as DOT language used in GraphViz) can be encapsulated in Prometheus Tcl. For example, graph mode is a mode where Prometheus enables users, who need not learn DOT language, to generate graphs using functions provided by the DOT language. For example, a Prometheus developer can provide Tcl API around the DOT language. A Prometheus user may then be provided with the full controllability and programmability of Prometheus Tcl, and all the features of DOT without having to learn DOT.

HTML mode is a mode where Prometheus enables users to generate HTML pages using a Tcl interface. HTML syntax is notorious for not being human friendly and readable. HTML mode may enable users to code HTML in Tcl constructs. In addition to HTML syntax, HTML mode may also support a markup language plug-in such as RedCloth via RubyGem, which gives users much greater ability and flexibility in codifying and describing HTML content. Prometheus may enable generation and automation of information and content into HTML within Prometheus environment; an example is an automatically generated Prometheus usage manual in HTML that can be opened via a web-browser.

Setup Mode is a mode where Prometheus enables support of complex and sophisticated environment management. Chip design, specifically physical design, may require terabytes of library and technology data across millions of files. For example, in 16 nm, there are 80+ libraries in TSMC. Each library may have tens of thousands of design collateral files. A modern chip design project may potentially need to process and organize 10 M+ library/technology files to do a chip. Library and technology data often do not have organizational or naming conventions, within or across vendors and foundries. Users work on multiple vendors and technology can also create challenges for convetional EDA systems. Setup mode is a framework where file and directory nomenclature, structure, organization, of libraries and technology files may be described, codified, and configured via EDA-tool-like commands within Prometheus, so that files and directories may then be identified, organized, and manifested in an environment file to be used for subsequent EDA chip design environment.

Figure 14:
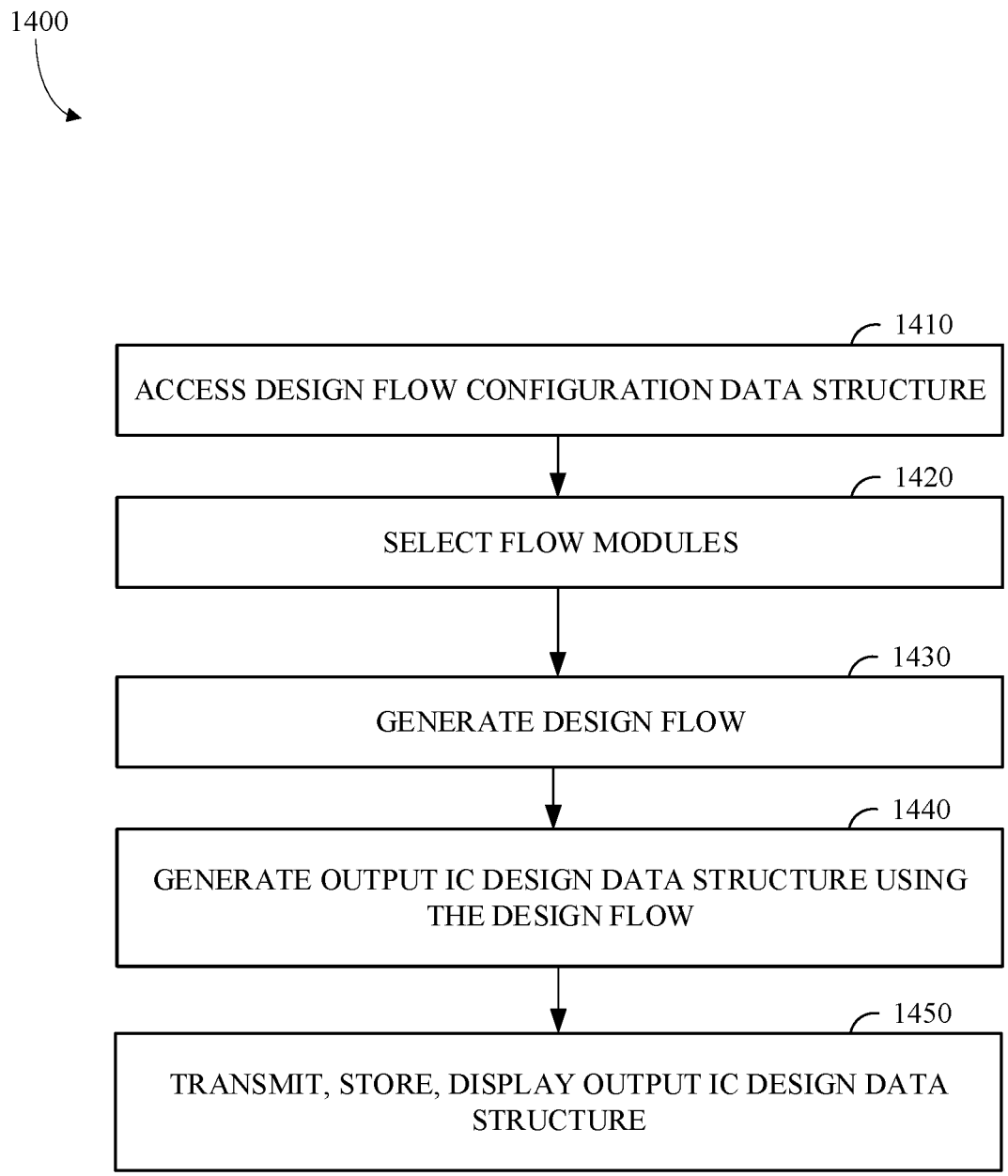
FIG. 14 is flow chart of an example of a process for generating and using a dynamic design flow.

FIG. 14 is flow chart of an example of a process 1400 for generating and using a dynamic design flow. The process 1400 includes accessing 1410 a design flow configuration data structure; based on the design flow configuration data structure, selecting 1420 multiple flowmodules from a set of flowmodules; based on the design flow configuration data structure, generating 1430 a design flow as a directed acyclic graph including the selected flowmodules as vertices; generating 1440 an output integrated circuit design data structure, based on one or more input integrated circuit design data structures, using the design flow to control the respective electronic design automation tools of the selected flowmodules; and transmitting, storing, or displaying 1450 the output integrated circuit design data structure. In some implementations the process 1400 may automatically generate a design flow and use the design flow to generate an integrated circuit design in response to a single command (e.g., a build command). For example, the process 1400 may be implemented by the integrated circuit design service infrastructure 110. For example, the process 1400 may be implemented by the system 100 of FIG. 1. For example, the process 1400 may be implemented by the physical design service module 160 of FIG. 1. For example, the process 1400 may be implemented by the register-transfer logic service module 130 of FIG. 1. For example, the process 1400 may be implemented by the software development kit service module 140 of FIG. 1. For example, the process 1400 may be implemented by the documentation service module 150 of FIG. 1. For example, the process 1400 may be implemented by the FPGA design service module 170 of FIG. 1. For example, the process 1400 may be implemented by the verification service module 180 of FIG. 1. For example, the process 1400 may be implemented by the system 300 of FIG. 3.

The process 1400 includes accessing 1410 a design flow configuration data structure (e.g., a file, a database, a repository, or a bitstream). The design flow configuration data structure is encoded in a tool control language (e.g., the Tcl scripting language). For example, the design flow configuration data structure may identify electronic design automation (EDA) tools to be used in a design flow. For example, the design flow configuration data structure may include configuration parameters for electronic design automation (EDA) tools to be used in a design flow. Appendix A below provides an example of content of a design flow configuration data structure in the Tcl language. For example, the design flow configuration data structure may be accessed 1410 by receiving the design flow configuration data structure (e.g., via network communications with the web client 102 or the scripting API client 104 using the network communications interface 318). For example, the design flow configuration data structure may be accessed 1410 by reading the design flow configuration data structure (e.g., reading from the memory 306 via the bus 304).

The process 1400 includes, based on the design flow configuration data structure, selecting 1420 multiple flowmodules from a set of flowmodules. Each flowmodule in the set of flowmodules provides an application programming interface, in the tool control language, to a respective electronic design automation tool. For example, a respective electronic design automation tool of one of the selected flowmodules may be a source synthesis tool, a place and route tool, or a static timing analysis tool (e.g., Synopsys, Cadence, and/or Mentor tools). In some implementations, the selected flowmodules include at least three flowmodules such that a respective electronic design automation tool of one of the selected flowmodules is a source synthesis tool, a respective electronic design automation tool of one of the selected flowmodules is a place and route tool, and a respective electronic design automation tool of one of the selected flowmodules is a static timing analysis tool.

The process 1400 includes, based on the design flow configuration data structure, generating 1430 a design flow as a directed acyclic graph including the selected flowmodules as vertices. For example, the design flow may be encoded as a make file. For example, the design flow may be encoded as a make++ file. For example, the design flow may be encoded as a SCons Python script. In some implementations, the design flow may be generated 1430 using an iterative process to adjust the configuration of the design flow to achieve performance goals for an integrated circuit design. For example, the design flow may be generated 1430 using the process 1700 of FIG. 17. In some implementations, the design flow may include vertices corresponding to tasks other than flowmodules (e.g., tasks for HTML generation or generation of graphical representations of design flows). For example, the design flow may include a task for generating HTML related to the integrated circuit design. In some implementations (not shown in FIG. 14), the process 1400 may include include generating a hypertext markup language data structure, based on the output integrated circuit design data structure, using the design flow; and transmitting, storing, or displaying the hypertext markup language data structure. In some implementations the design flow may be hierarchical—a including vertex that corresponds to a task for using a subflow, which is itself a directed acyclic graph of tasks.

The process 1400 includes generating 1440 an output integrated circuit design data structure, based on one or more input integrated circuit design data structures, using the design flow to control the respective electronic design automation tools of the selected flowmodules. In some implementations, the output integrated circuit design data structure includes a physical design data structure for an integrated circuit. For example, the output integrated circuit design data structure may include a GDSII file for an integrated circuit. In some implementations, the one or more input integrated circuit design data structures include a register-transfer level data structure. In some implementations, the output integrated circuit design data structure may be generated 1440 using an iterative process to adjust the configuration of the design flow to achieve performance goals for an integrated circuit design. For example, the output integrated circuit design data structure may be generated 1440 using the process 1700 of FIG. 17.

The process 1400 includes transmitting, storing, or displaying 1450 the output integrated circuit design data structure. For example, the output integrated circuit design data structure may be a collection of files, an archive, or a repository (e.g., a GitHub repository) that includes data from a register-transfer level data structure, a software development kit, a physical design data structure, and/or test results. For example, the output integrated circuit design data structure may include the documentation generated using the design flow and/or a field programmable gate array emulation data structure generated using the design flow. For example, the output integrated circuit design data structure may be transmitted 1450 to an external device (e.g., a personal computing device) for display or storage. For example, the output integrated circuit design data structure may be stored 1450 in memory (e.g., the memory 306). For example, output integrated circuit design data structure may be displayed 1450 in a user interface (e.g., the user interface 320). For example, the output integrated circuit design data structure may be transmitted 1450 via a network communications interface (e.g., the network communications interface 318).

Although the process 1400 is shown as a series of operations for clarity, implementations of the process 1400 or any other technique, process, or algorithm described in connection with the implementations disclosed herein can be performed in various orders or concurrently. Additionally, operations in accordance with this disclosure can be performed with other operations not presented and described herein. For example, the process 1400 may also include generating a graphical representation of the directed acyclic graph of the design flow; and transmitting, storing, or displaying the graphical representation. Furthermore, one or more aspects of the systems and techniques described herein can be omitted. For example, operation 1450 may be omitted from the process 1400.

Figure 15:
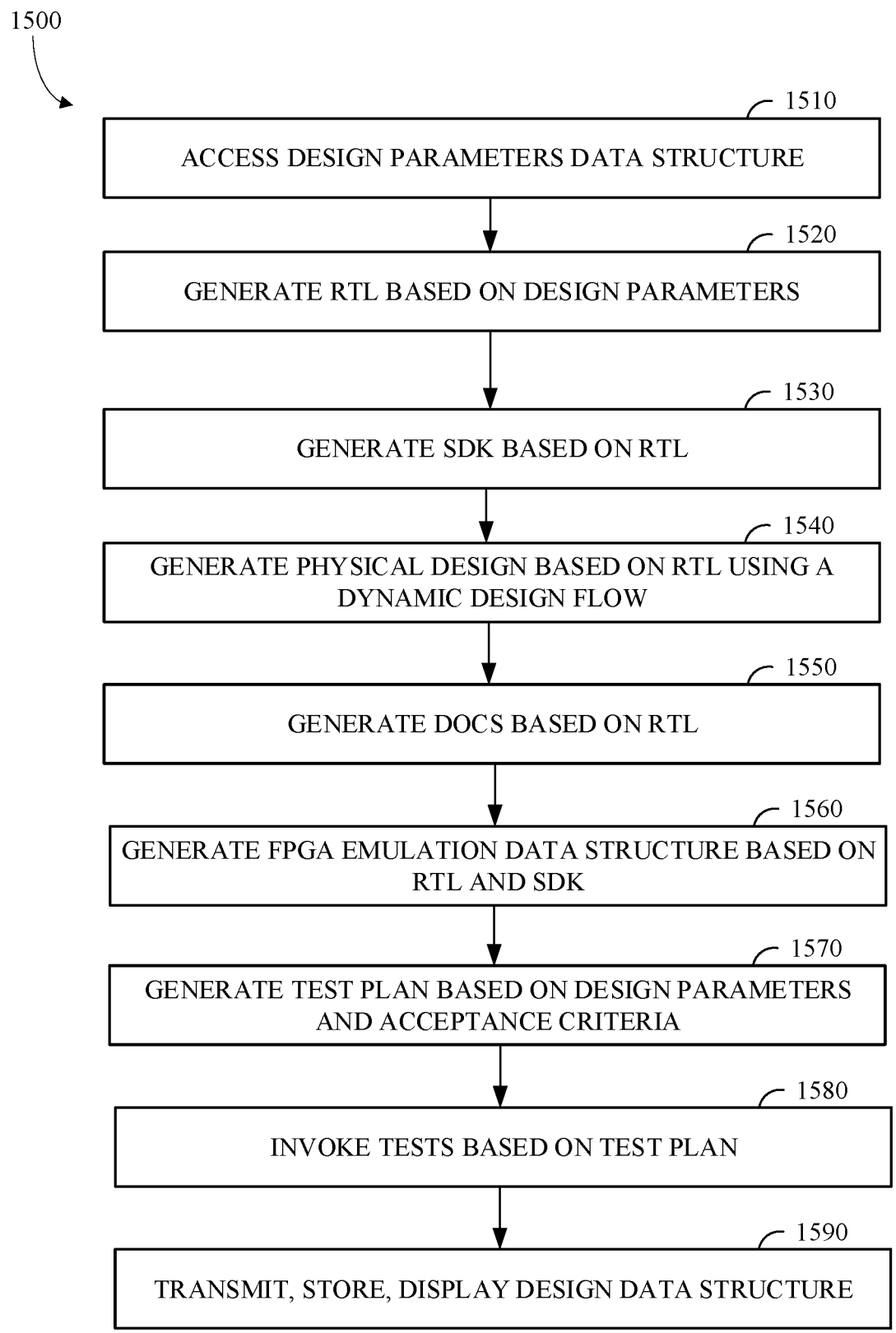
FIG. 15 is flow chart of an example of a process for using a dynamic design flow to generate a physical design data structure for an integrated circuit based on a register-transfer level data structure.

In some implementations, the process 1400 may be implemented as part of a larger automated design flow for an integrated circuit (e.g., as described in relation to the process 1500 of FIG. 15). For example, the design flow configuration data structure may be part of a design parameters data structure (e.g., design parameters data structure 122). For example, the process 1400 may be augmented to include accessing the design parameters data structure, wherein the design parameters data structure includes values of design parameters of an integrated circuit design; responsive to a command identifying the design parameters data structure, generating a register-transfer level data structure for an integrated circuit based on the design parameters data structure; responsive to the command identifying the design parameters data structure, generating a software development kit for the integrated circuit based on the register-transfer level data structure; wherein the multiple flowmodules are selected responsive to the command identifying the design parameters data structure; wherein the design flow is generated responsive to the command identifying the design parameters data structure; wherein the output integrated circuit design data structure includes a physical design data structure for the integrated circuit that is generated, responsive to the command identifying the design parameters data structure, based on the register-transfer level data structure; responsive to the command identifying the design parameters data structure, generating a test plan for an integrated circuit based on the design parameters data structure and acceptance criteria; responsive to the command identifying the design parameters data structure, invoking tests for the integrated circuit based on the test plan, the register-transfer level data structure, the software development kit, and the physical design data structure to obtain a set of test results; and transmitting, storing, or displaying a design data structure based on the register-transfer level data structure, the software development kit, the physical design data structure, and the test results. For example, the process 1400 may be augmented to include transmitting a physical design specification based on the physical design data structure to a server (e.g., the manufacturer server 230) to invoke manufacturing of the integrated circuit. In some implementations, the process 1400 is augmented to include manufacturing the integrated circuit; installing the integrated circuit in a system configured to operate the integrated circuit responsive to commands received via communications with a cloud server; and transmitting a login for accessing and controlling the integrated circuit.

FIG. 15 is flow chart of an example of a process 1500 for using a dynamic design flow to generate a physical design data structure for an integrated circuit based on a register-transfer level data structure. The process 1500 includes accessing 1510 a design parameters data structure; generating 1520 a register-transfer level data structure for an integrated circuit based on the design parameters data structure; generating 1530 a software development kit for the integrated circuit based on the register-transfer level data structure; generating 1540 a physical design data structure for the integrated circuit based on the register-transfer level data structure using a dynamic design flow; generating 1550 documentation for the integrated circuit based on the register-transfer level data structure; generating 1560 a field programmable gate array emulation data structure for the integrated circuit based on the register-transfer level data structure and the software development kit; generating 1570 a test plan for an integrated circuit based on the design parameters data structure and acceptance criteria; invoking 1580 tests for the integrated circuit based on the test plan, the register-transfer level data structure, the software development kit, and the physical design data structure to obtain a set of test results; and transmitting, storing, or displaying 1590 a design data structure based on the register-transfer level data structure, the software development kit, the physical design data structure, and the test results. The process 1500 may automatically generate and test an integrated circuit design conforming to design parameter values in a design parameters data structure in response to a single command (e.g., a build command). For example, the process 1500 may be implemented by the integrated circuit design service infrastructure 110. For example, the process 1500 may be implemented by the system 100 of FIG. 1. For example, the process 1500 may be implemented by the system 300 of FIG. 3.

The process 1500 includes accessing 1510 a design parameters data structure (e.g., a file, a database, a repository, or a bitstream). The design parameters data structure includes values of design parameters of an integrated circuit design. In some implementations, the design parameter data structure includes a design flow configuration data structure. The design flow configuration data structure may be encoded in a tool control language (e.g., the Tcl scripting language). For example, the design flow configuration data structure may identify electronic design automation (EDA) tools to be used in a design flow. For example, the design flow configuration data structure may include configuration parameters for electronic design automation (EDA) tools to be used in a design flow. For example, the integrated circuit design may be of an IP core. For example, the integrated circuit design may be of a system-on-a-chip. For example, the design parameters data structure may include a JSON file. For example the design parameters of the design parameters data structure may include whether privilege modes are supported, whether multiply extension is supported, whether floating point extension is supported, whether error-correcting codes are supported in on-chip memory, the size of an instruction cache, an associativity of the instruction cache, a size of a data subsystem in on-chip memory, whether a port (e.g., a front port, a system port, a peripheral port, or a memory port) are included, a count of memory port channels, a port communication protocol selection, a bus width, a count of physical memory protection units, whether JTAG debugging is supported, a count of hardware breakpoints, whether instruction tracing is supported, whether debug direct memory access is supported, a count of local interrupts, whether a platform level interrupt controller is supported, a count of interrupt priority levels, a count of global interrupts, whether branch prediction is supported, a count of branch target buffer entries, a count of branch history table entries, and/or a selection of a manufacturing process. For example, the design parameters data structure may be accessed 1510 by receiving the design parameters data structure (e.g., via network communications with the web client 102 or the scripting API client 104 using the network communications interface 318). For example, the design parameters data structure may be accessed 1510 by reading the design parameters data structure (e.g., reading from the memory 306 via the bus 304).

The process 1500 includes, responsive to a command identifying the design parameters data structure, generating 1520 a register-transfer level data structure for an integrated circuit based on the design parameters data structure. For example, command may be a build command issued by a user through an icon of a web interface of the web application server 112 using the web client 102. For example, command may be a build command issued by a script running on the scripting API client 104 via the scripting API server 114. The command may identify the design parameters data structure either explicitly or implicitly. For example, the command may identify the design parameters data structure by being sent with a copy of the design parameters data structure. For example, the command may identify the design parameters data structure by including a pointer or other reference to the design parameters data structure, which has been previously stored. For example, design parameters data structure may include a JSON file listing identifiers of design parameters and corresponding values. In some implementations, the design parameters data structure also includes an indication (e.g., a pointer, a name, or another identifier) that identifies a template integrated circuit design that the design parameters modify. For example, the template integrated circuit design may include modular design data structures that adhere to conventions for facilitating modular design. For example, generating 1520 the register-transfer level data structure for the integrated circuit based on the design parameters data structure may include invoking a register-transfer level service (e.g., the register-transfer level service module 130) with data based on the design parameters data structure. For example, the process 600 of FIG. 6 may be implemented to generate 1520 a register-transfer level data structure for an integrated circuit based on the design parameters data structure.

For example, the register-transfer level data structure may include one or more Verilog files. The register-transfer level data structure may include updated configuration settings to drive later stages of an integrated circuit design pipeline. In some implementations, the register-transfer level data structure includes a memory map, one or more port assignments, and floorplan information.

The register-transfer level data structure (e.g., a register-transfer level file) may be automatically generated 1520 based on the design parameters data structure using tools, such as Scala, Chisel, Diplomacy, and/or FIRRTL. For example, generating 1520 the register-transfer level data structure for the integrated circuit may include executing Scala code to read the design parameters data structure and dynamically generate a circuit graph. In some implementations, generating 1520 the register-transfer level data structure for the integrated circuit includes invoking a Diplomacy package in Chisel to determine a bus protocol for the integrated circuit.

The process 1500 includes, responsive to the command identifying the design parameters data structure, generating 1530 a software development kit for the integrated circuit based on the register-transfer level data structure. In some implementations, generating 1530 the software development kit for the integrated circuit includes generating loaders for a Verilog simulator and a physical field programmable gate array to be flashed. For example, generating 1530 the software development kit may include accessing an existing toolchain or software development kit for a template integrated circuit design that is identified by the design parameters data structure. The existing toolchain or software development kit (e.g., a RISC-V toolchain/SDK) may be set up using conventions suitable for configurability. For example, the existing toolchain or software development kit may be organized into submodules corresponding to design parameters of the design parameters data structure. For example, the software development kit may include a compiler, an assembler, header files, libraries, boot loaders, kernel drivers, and/or other tools for a fully functional SDK/computing environment. For example, generating 1530 the software development kit may include executing a Python script. In some implementations, generating 1530 the software development kit includes parsing the register-transfer level data structure (e.g., a JSON file), generating options for the tools and builds, generating header files responsive to a memory map, selecting appropriate examples from the existing toolchain or software development kit, generating relevant configuration files for target simulators (e.g., QEMU (Quick Emulator)) so they can run the new design on another processor (e.g., x86), and generating loaders for Verilog simulators and physical FPGA boards to be flashed. The resulting software development kit may be built and tested in the cloud (e.g., before giving to customer). For example, generating 1530 the software development kit may include invoking a software development kit service (e.g., the software development kit service module 140) with data based on register-transfer level data structure and/or the design parameters data structure.

The process 1500 includes, responsive to the command identifying the design parameters data structure, generating 1540 a physical design data structure (e.g., a physical design file) for the integrated circuit based on the register-transfer level data structure using a dynamic design flow. For example, the generating the dynamic design flow and using it to generate the physical design data structure may include implementing the process 1400 of FIG. 14. For example, generating 1540 a physical design data structure for the integrated circuit may include invoking a physical design service (e.g., the physical design service module 160) with data based on register-transfer level data structure and/or the design parameters data structure. For example, generating 1540 a physical design data structure for the integrated circuit may include determining power, performance, and area estimates for the resulting integrated circuit design and providing these estimates as feedback to a user (e.g., a user of the web client 102). For example, the physical design data structure may include in less-technical terms whether there are any issues with the physical design. For example, the physical design data structure may highlight important components of the output of the synthesis and place & route tools. For example, the physical design data structure may include a GDSII file or an OASIS file. For example, generating 1540 a physical design data structure for the integrated circuit may include managing and orchestrating physical design toolchains in a cloud. For example, generating 1540 a physical design data structure for the integrated circuit may include handling database movement from tool to tool, and managing access to third party IP cores. For example, generating 1540 a physical design data structure for the integrated circuit may include accessing template designs, which may allow for significant design reuse. For example, generating 1540 a physical design data structure for the integrated circuit may include identifying those combinations to reduce workload. For example, generating 1540 a physical design data structure for the integrated circuit may provide better or more compact error/issue reporting, by translating tool issues into manageable feedback and providing the actual error/output of tools in a deliverable format to a user (e.g., a user of the web client 102). For example, generating 1540 a physical design data structure for the integrated circuit may include using physical design blocks for identified pairings of functional blocks that may be reused across designs to improve efficiency.

The process 1500 includes, responsive to the command identifying the design parameters data structure, generating 1550 documentation for the integrated circuit based on the register-transfer level data structure. For example, generating 1550 documentation for the integrated circuit may include using Prince (available at https://www.princexml.com/). For example, generating 1550 documentation for the integrated circuit may include using ASCII Doc (available at http://asciidoc.org/). For example, generating 1550 documentation for the integrated circuit may include accessing a pre-loaded modular manual for a template integrated circuit design that is identified by the design parameters data structure. The modular manual may be set up using conventions suitable for configurability. For example, the modular manual may be organized into submodules corresponding to design parameters of the design parameters data structure. In some implementations, the modular manual is stored as multiple components in corresponding directories of an existing SDK for the template. Generating 1550 documentation for the integrated circuit may include generalizing the pre-loaded modular manual to respond to values of design parameters in the design parameters data structure. For example, the generated 1550 documentation may be in an HTML format and/or in a PDF format. In order to correctly document the memory map/ports, generating 1550 documentation for the integrated circuit may include working with the post-RTL output. For example, generating 1550 documentation for the integrated circuit may include utilizing a documentation framework similar to the React framework (e.g., a JS HTML framework). In some implementations, documentation blocks have a respective piece of python code that takes in an RTL output configuration file and breaks it down into the chunks that ASCII Doc requires and invokes content generation. For example, generating 1550 documentation for the integrated circuit may include implementing the process 800 of FIG. 8. For example, generating 1550 documentation for the integrated circuit may include invoking a documentation service (e.g., the documentation service module 150) with data based on register-transfer level data structure and/or the design parameters data structure.

The process 1500 includes, responsive to the command identifying the design parameters data structure, generating 1560 a field programmable gate array emulation data structure (e.g., a field programmable gate array emulation file) for the integrated circuit based on the register-transfer level data structure and the software development kit. For example, the field programmable gate array emulation data structure for the integrated circuit may be configured to utilize a cloud based field programmable gate array (FPGA). For example, generating 1560 a field programmable gate array emulation data structure for the integrated circuit may include invoking a cloud based FPGA synthesis tool. For example, generating 1560 a field programmable gate array emulation data structure for the integrated circuit may include invoking emulation platforms, such as, Palladium (from Cadence), Veloce (from Mentor Graphics), and/or Zebu (from Synopsys). For example, the field programmable gate array emulation data structure for the integrated circuit may be configured to handle emulating devices hard drives and network devices. For example, the field programmable gate array emulation data structure may include an emulation file and supporting materials. In some implementations, the field programmable gate array emulation data structure for the integrated circuit may provide for emulation of a whole system, including peripherals, operating together (e.g., memory timing needs to be matched). For example, the peripherals emulated may be the actual peripherals a user has selected in the web interface generated by the web application server 112. For example, generating 1560 a field programmable gate array emulation data structure for the integrated circuit may include highly detailed use of existing tools based on the parameterized integrated circuit design. For example, generating 1560 a field programmable gate array emulation data structure for the integrated circuit may include invoking the FPGA/Emulator toolchain, setting up the emulated devices, and compiling the emulated devices. For example, generating 1560 a field programmable gate array emulation data structure for the integrated circuit may include invoking a FPGA/emulation service (e.g., the field programmable gate array design service module 170) with data based on register-transfer level data structure and/or the design parameters data structure.

The process 1500 includes, responsive to the command identifying the design parameters data structure, generating 1570 a test plan for an integrated circuit based on the design parameters data structure and acceptance criteria. In some implementations, the acceptance criteria are received with the design parameters data structure (e.g., received from the web client 102 or received from the scripting API client 104). In some implementations, the acceptance criteria are read from memory (e.g., the memory 306). For example, generating 1570 a test plan for an integrated circuit may include invoking Verilog simulators (e.g., open source Verilog simulators). For example, the test plan for an integrated circuit may include utilizing FPGAs. For example, the test plan for an integrated circuit may include utilizing software simulators, such as Quick Emulator (QEMU), Spike, and/or other software simulators. In some implementations, multiple target test platforms look the same so the test plan for an integrated circuit may include moving the workloads across different cost options (e.g., using physical FPGAs vs. cheaper using pre-emptible cloud instances). For example, a test plan for an integrated circuit may be generated 1570 based on the register-transfer level data structure (e.g., including Verilog RTL), the software development kit, the physical design data structure (e.g., including a GDSII file), a corpus of tests, and corresponding acceptance criteria. In some implementations, generating 1570 a test plan for an integrated circuit may include responding to varying acceptance criteria that are user-defined. Given acceptance criteria and a design configuration, a test plan may be generated 1570 automatically. For example, generating 1570 a test plan for an integrated circuit may include defining environments, filtering out tests that cannot be run given a corpus of tests and a hardware and software design generated based on the design parameters data structure, and generating the test plan to include a sequence of selected tests for the integrated circuit design. For example, an environment may define a test platform. There may be additional components in a test bench, outside the device under test, and it may be beneficial to standardize these environments across designs. For example, a way to end a test may be standardized within a test platform. Some test platforms may define a register a CPU can write to that is defined within the test bench, while some test platforms will wiggle a general purpose input/output (GPIO) pin in a certain way. Given a test plan, many test platforms may be used for all tests.

The process 1500 includes, responsive to the command identifying the design parameters data structure, invoking 1580 tests for the integrated circuit based on the test plan, the register-transfer level data structure, the software development kit, and the physical design data structure to obtain a set of test results. For example, the invoked 1580 verification tests may be executed directly by a controller (e.g., the controller 120), by a verification service (e.g., the verification service module 180), and/or by an external service (e.g., a cloud based FPGA or emulation service that is accessed via communications over a network). In some implementations, invoking 1580 tests for the integrated circuit may include invoking a test using a field programmable gate array, programmed based on the field programmable gate array emulation data structure, to obtain an emulation result. The field programmable gate array may be operating on a cloud server. For example, invoking 1580 tests for the integrated circuit may include using credentials (e.g., a login and/or password) to invoke the test on the field programmable gate array operating on a cloud server. For example, the test results may include summary information for a large number of tests, such as a binary indication of whether all acceptance criteria were met by the generated integrated circuit design, or a list of binary indications of whether individual verification tests were passed for respective verification tests included in the test plan.

The process 1500 includes transmitting, storing, or displaying 1590 a design data structure based on the register-transfer level data structure, the software development kit, the physical design data structure, and the test results. For example, the design data structure may be a collection of files, an archive, or a repository (e.g., a GitHub repository) that includes data from the register-transfer level data structure, the software development kit, the physical design data structure, and the test results. For example, the design data structure may also include the documentation generated 1550 and/or the field programmable gate array emulation data structure generated 1560. For example, the design data structure may be transmitted 1590 to an external device (e.g., a personal computing device) for display or storage. For example, the design data structure may be stored 1590 in memory (e.g., the memory 306). For example, design data structure may be displayed 1590 in a user interface (e.g., the user interface 320). For example, the design data structure may be transmitted 1590 via a network communications interface (e.g., the network communications interface 318).

Although the process 1500 is shown as a series of operations for clarity, implementations of the process 1500 or any other technique, process, or algorithm described in connection with the implementations disclosed herein can be performed in various orders or concurrently. Additionally, operations in accordance with this disclosure can be performed with other operations not presented and described herein. For example, the process 500 of FIG. 5 may be used to iterate the process 1500 with varying design parameters to search a design space. Furthermore, one or more aspects of the systems and techniques described herein can be omitted. For example, operation 1550 may be omitted from the process 1500.

Figure 16:
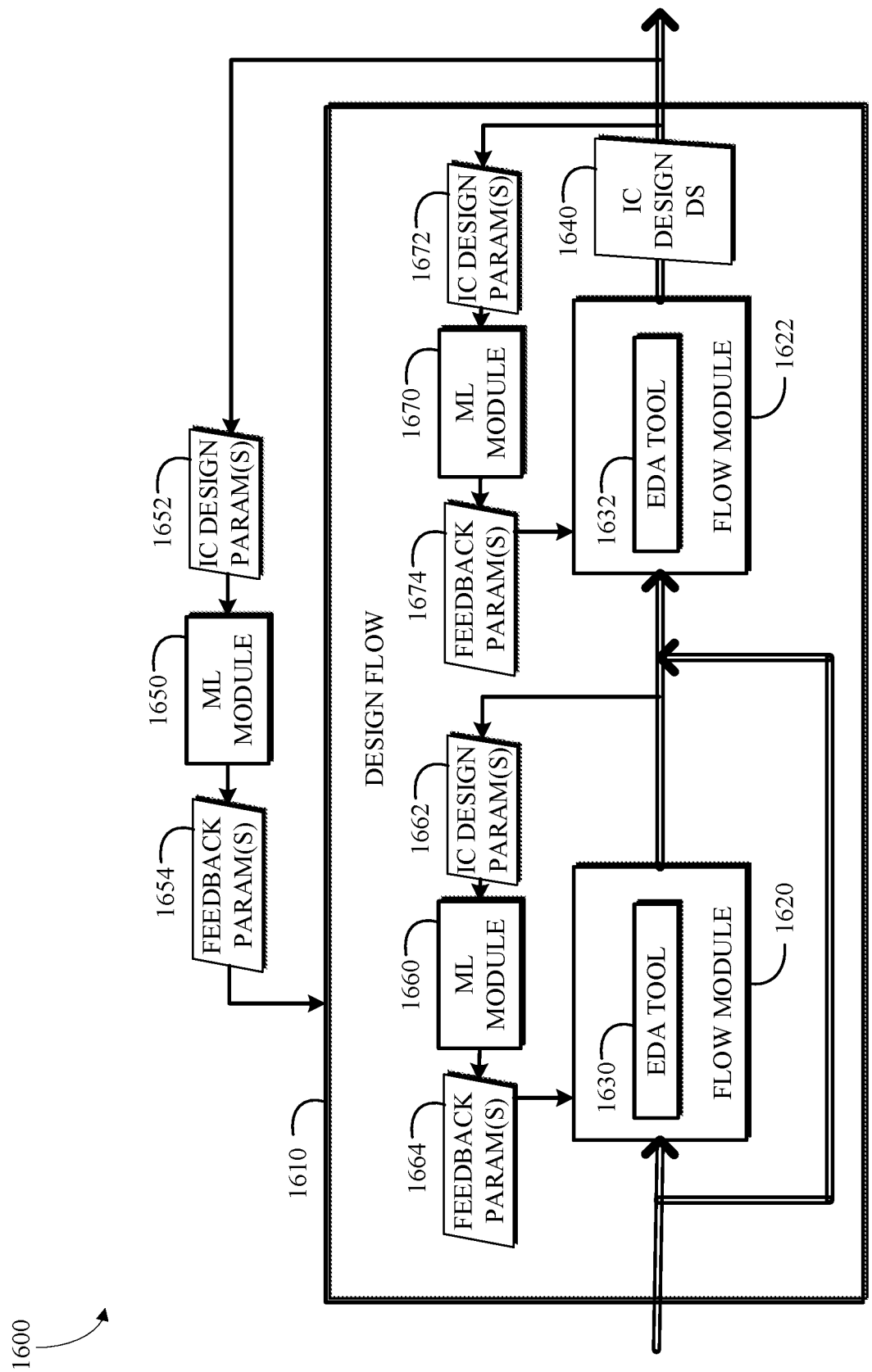
FIG. 16 is block diagram of an example of a system for updating a design flow for facilitating design of integrated circuits.

FIG. 16 is block diagram of an example of a system 1600 for updating a design flow 1610 for facilitating design of integrated circuits. The system 1600 includes a design flow 1610 and some machine learning modules (1650, 1660, and 1670) configured to provide feedback for iteratively reconfiguring the design flow 1610 at various hierarchical levels of the design flow 1610. In this example, the design flow 1610 includes two tasks: the flowmodule 1620 and the flowmodule 1622. For example, the design flow 1610 may be configured, at least initially, based on a design flow configuration data structure. For example, the input to the design flow 1610 may include a design parameters data structure (e.g., the design parameters data structure 122) and/or one or more integrated circuit design data structures (e.g., the register-transfer level data structure 132). For example, an integrated circuit design data structure 1640 is output by the design flow 1610, which may include one or more constituent integrated circuit design data structures (e.g., the physical design data structure 162).

In this example, the design flow includes a sequence of flowmodules, the flowmodule 1620 and the flowmodule 1622. The flowmodule 1620 provides a tool control language interface to the electronic design automation tool 1630 (e.g., a synthesis or place & route tool). The flowmodule 1622 provides a tool control language interface to the electronic design automation tool 1632 (e.g., a static timing analysis tool).

The system 1600 includes machine learning modules (1650, 1660, and 1670) configured to provide feedback for adjusting the design flow 1610 as a whole and/or the vertices or tasks of the design flow 1610. The machine learning module 1650 takes as input one or more parameters 1652 of the integrated circuit design data structure 1640 that is output by the design flow 1610. For example, the one or more parameters 1652 may include power, performance, and/or area estimates for an integrated circuit described by the integrated circuit design data structure 1640. For example, the electronic design automation tool 1632 may provide estimates of power, performance, and/or area for the integrated circuit design data structure 1640. The machine learning module 1650 may also take additional information (not explicitly shown in FIG. 16) as input, such as, for example, performance targets for the one or more parameters 1652; corresponding estimates of the one or more parameters 1652 that are based on an integrated circuit design data structure that was input to the design flow 1610; and or a design flow configuration data structure that was used to configure the design flow 1610. The machine learning module 1650 outputs one or more feedback parameters 1654. For example, the one or more feedback parameters 1654 may encode adjustments to a design flow configuration data structure that was used to configure the design flow 1610. For example, the one or more feedback parameters 1654 may be an adjusted design flow configuration data structure (e.g., including a tool control language file) that may be used to reconfigure the design flow 1610. For example, the one or more feedback parameters 1654 may specify changes to the topology of the design flow 1610, such as adding, removing, or swapping out tasks (e.g., flowmodules) in the design flow 1610. For example, the one or more feedback parameters 1654 may specify changes to the order of tasks (e.g., the flowmodule 1620 or the flowmodule 1622) in the design flow 1610. For example, the one or more feedback parameters 1654 may specify changes to the configuration of individual tasks (e.g., the flowmodule 1620 or the flowmodule 1622) in the design flow 1610. For example, the machine learning module 1650 may include a neural network that has been trained to identify adjustments to a design flow configuration data structure for a design flow that cause changes in the one or more parameters 1652 of an integrated circuit.

The machine learning module 1660 takes as input one or more parameters 1662 of the integrated circuit design data structure that is output by the flowmodule 1620. For example, the one or more parameters 1662 may include power, performance, and/or area estimates for an integrated circuit described by the output of the flowmodule 1620. For example, the electronic design automation tool 1630 may provide estimates of power, performance, and/or area for the integrated circuit available at this stage in the design flow 1610. The machine learning module 1660 may also take additional information (not explicitly shown in FIG. 16) as input, such as, for example, performance targets for the one or more parameters 1662; corresponding estimates of the one or more parameters 1662 that are based on an integrated circuit design data structure that was input to the flowmodule 1620; and or a design flow configuration data structure that was used to configure the flowmodule 1620. The machine learning module 1660 outputs one or more feedback parameters 1664. For example, the one or more feedback parameters 1664 may encode adjustments to a design flow configuration data structure that was used to configure the flowmodule 1620. For example, the one or more feedback parameters 1664 may be an adjusted design flow configuration data structure (e.g., including a tool control language file) that may be used to reconfigure the flowmodule 1620. For example, the one or more feedback parameters 1664 may specify changes to the configuration of the flowmodule 1620. For example, the machine learning module 1660 may include a neural network that has been trained to identify adjustments to a design flow configuration data structure for a flowmodule that cause changes in the one or more parameters 1662 of an integrated circuit.

The machine learning module 1670 takes as input one or more parameters 1672 of the integrated circuit design data structure 1640 that is output by the flowmodule 1622. For example, the one or more parameters 1672 may include power, performance, and/or area estimates for an integrated circuit described by the output of the flowmodule 1622. For example, the electronic design automation tool 1630 may provide estimates of power, performance, and/or area for the integrated circuit available at this stage in the design flow 1610. The machine learning module 1670 may also take additional information (not explicitly shown in FIG. 16) as input, such as, for example, performance targets for the one or more parameters 1672; corresponding estimates of the one or more parameters 1672 that are based on an integrated circuit design data structure that was input to the flowmodule 1622; and or a design flow configuration data structure that was used to configure the flowmodule 1622. The machine learning module 1670 outputs one or more feedback parameters 1674. For example, the one or more feedback parameters 1674 may encode adjustments to a design flow configuration data structure that was used to configure the flowmodule 1622. For example, the one or more feedback parameters 1674 may be an adjusted design flow configuration data structure (e.g., including a tool control language file) that may be used to reconfigure the flowmodule 1622. For example, the one or more feedback parameters 1674 may specify changes to the configuration of the flowmodule 1622. For example, the machine learning module 1670 may include a neural network that has been trained to identify adjustments to a design flow configuration data structure for a flowmodule that cause changes in the one or more parameters 1672 of an integrated circuit.

A machine learning module may also be used to iteratively adjust integrated circuit design parameters that are input to the design flow 1610 or an individual flowmodule (e.g., the flowmodule 1620 or the flowmodule 1622). In some implementations (not shown in FIG. 16), the machine learning module 1650 may also output feedback parameters that specify adjustments to integrated circuit design parameters that are input to the design flow 1610. In some implementations (not shown in FIG. 16), the machine learning module 1660 may also output feedback parameters that specify adjustments to integrated circuit design parameters that are input to the flowmodule 1620. In some implementations (not shown in FIG. 16), the machine learning module 1670 may also output feedback parameters that specify adjustments to integrated circuit design parameters that are input to the flowmodule 1622.

Figure 17:
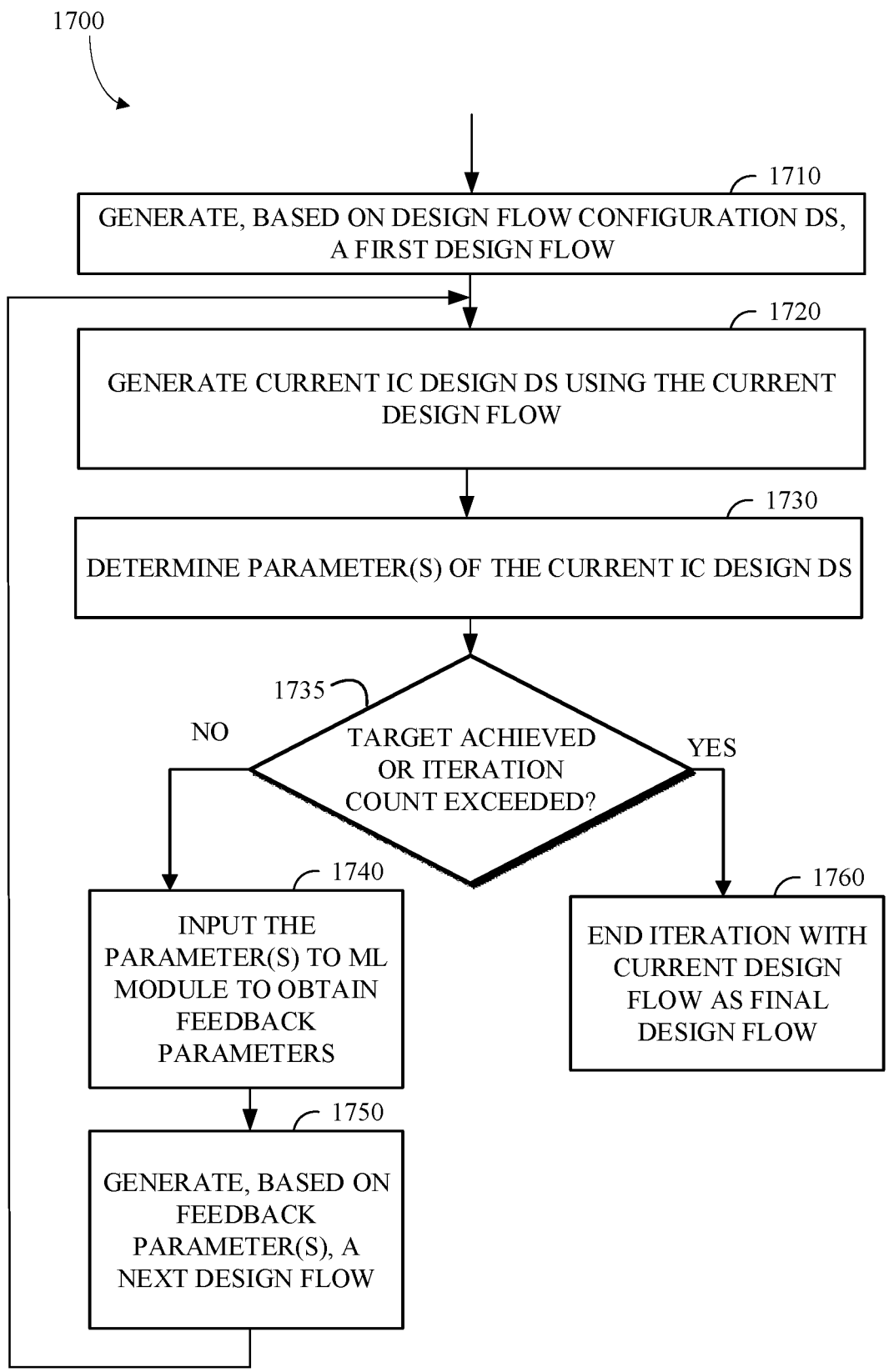
FIG. 17 is flow chart of an example of a process for generating a design flow.

FIG. 17 is flow chart of an example of a process 1700 for generating a design flow. The process 1700 includes generating 1710, based on the design flow configuration data structure, a first design flow; generating 1720 a current integrated circuit design data structure, based on one or more input integrated circuit design data structures, using the first design flow; determining 1730 one or more parameters of the current integrated circuit design data structure; when (at operation 1735) another iteration called for, inputting 1740 the one or more parameters to a machine learning module to obtain one or more feedback parameters as output of the machine learning module; generating 1750, based on the one or more feedback parameters, a next design flow, to start a next iteration of the design flow; and, when (at operation 1735) another iteration is not called for, ending 1760 iteration with the current design flow as the final design flow. For example, the process 1700 may be implemented by the integrated circuit design service infrastructure 110. For example, the process 1700 may be implemented by the system 100 of FIG. 1. For example, the process 1700 may be implemented by the physical design service module 160 of FIG. 1. For example, the process 1700 may be implemented by the register-transfer logic service module 130 of FIG. 1. For example, the process 1700 may be implemented by the software development kit service module 170 of FIG. 1. For example, the process 1700 may be implemented by the documentation service module 150 of FIG. 1. For example, the process 1700 may be implemented by the FPGA design service module 170 of FIG. 1. For example, the process 1700 may be implemented by the verification service module 180 of FIG. 1. For example, the process 1700 may be implemented by the system 300 of FIG. 3.

The process 1700 includes generating 1710, based on the design flow configuration data structure, a first design flow. The first design flow may be generated 1710 as a directed acyclic graph including the selected flowmodules as vertices. For example, the first design flow may be encoded as a make file. For example, the first design flow may be encoded as a make++ file. For example, the first design flow may be encoded as a SCons Python script.

The process 1700 includes generating 1720 a current integrated circuit design data structure, based on one or more input integrated circuit design data structures, using a current design flow (e.g., the first design flow or a next design flow). The current integrated circuit design data structure may be generated 1720 using the current design flow to control the respective electronic design automation tools of the selected flowmodules. In some implementations, the output integrated circuit design data structure includes a physical design data structure for an integrated circuit. For example, the current integrated circuit design data structure may include a GDSII file for an integrated circuit. In some implementations, the one or more input integrated circuit design data structures include a register-transfer level data structure.

The process 1700 includes determining 1730 one or more parameters (e.g., the one or more parameters 1652) of the current integrated circuit design data structure. For example, the one or more parameters of the current integrated circuit design data structure (e.g., the first integrated circuit design data structure) include estimates of power, performance, and/or area for an integrated circuit described by the current integrated circuit design data structure. For example, an EDA tool may provide estimates of power, performance, and/or area for the current integrated circuit design data structure.

The process 1700 includes, when (at operation 1735) a performance target is not achieved and an iteration count is not exceeded, inputting 1740 the one or more parameters to a machine learning module (e.g., the machine learning module 1650) to obtain one or more feedback parameters as output of the machine learning module. The machine learning module takes as input the one or more parameters of the current integrated circuit design data structure. The machine learning module may also take additional information as input, such as, for example, performance targets for the one or more parameters; corresponding estimates of the one or more parameters that are based on an integrated circuit design data structure that was input to the current design flow; and or a design flow configuration data structure that was used to configure the current design flow. For example, the one or more feedback parameters may encode adjustments to a design flow configuration data structure that was used to configure the current design flow. For example, the one or more feedback parameters may be an adjusted design flow configuration data structure (e.g., including a tool control language file) that may be used to reconfigure the current design flow. For example, the one or more feedback parameters may specify changes to the topology of the current design flow, such as adding, removing, or swapping out tasks (e.g., flowmodules) in the current design flow. For example, the one or more feedback parameters may specify changes to the order of tasks (e.g., the flowmodules) in the current design flow. For example, the one or more feedback parameters may specify changes to the configuration of individual tasks (e.g., a flowmodule) in the current design flow. For example, the machine learning module may include a neural network that has been trained to identify adjustments to a design flow configuration data structure for a design flow that cause changes in the one or more parameters of an integrated circuit.

The process 1700 includes generating 1750, based on the one or more feedback parameters, a next design flow. The next design flow may be generated 1750 as a directed acyclic graph including the selected flowmodules as vertices. For example, the next design flow may be encoded as a make file. For example, the next design flow may be encoded as a make++ file. For example, the next design flow may be encoded as a SCons Python script.

While the disclosure has been described in connection with certain embodiments, it is to be understood that the disclosure is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures.

APPENDIX A

```
################################################################

# Create Flow for Design
################################################################

#-------------------------------------------------------------------------------------
# setup
#-------------------------------------------------------------------------------------
# specify design config
set global_config config/global/design.tcl
set design_config config/$SETUP(design)/design.tcl
source $global_config
source $design_config
# source external override file
if { [info exists SETUP(override)] && $SETUP(override) ne "" } {
    source $SETUP(override)
}
#-------------------------------------------------------------------------------------
# Flow setup
#-------------------------------------------------------------------------------------
# activate flow mode
flow_mode
# create flow
create_flow $SETUP(design)
current_flow $SETUP(design)
# set fmtask tag
set_fmtask_tag SETUP \
    --key design \
    --value $SETUP(design)
#-------------------------------------------------------------------------------------
# Independent Task setup
#-------------------------------------------------------------------------------------
# create itask teco
set_tasks [create_tasks teco] \
    --type fmtask \
    --flow teco_pts \
    --inputs {
        netlist                  ../pnr/output/${SETUP(design)}.sta.v
```

```
        spef              ../rcxt/output
        def               ../pnr/output/${SETUP(design)}.def
        milkyway_ref_lef  ../pnr/output/milkyway_ref_lef
    } \
    --configs {
        num_process  16
        num_cpu      2
    }
# create itask release
set_tasks [create_tasks rel] \
    --type fmtask \
    --flow rel_prometheus \
    --configs {
        block_or_chip chip
        release_dir /work/project/tsmc/cln28hpc/almond/rel
    }
# create itask tidy
set_tasks [create_tasks tidy] \
    --commands {
        {${RM} *.log}
    }
#-------------------------------------------------------------
# Dependent Task setup
#-------------------------------------------------------------
# create links
create_links { mbist syn scan pnr ipmerge }
create_links { mbist lec1 }
create_links { {mbist syn} lec2}
create_links { {syn scan} lec3 }
create_links { {mbist scan} atpg }
create_links { {mbist scan atpg} dfts }
create_links { {mbist scan pnr} atpg2 }
create_links { {mbist scan pnr atpg2 etm} dfts2 }
create_links { ipmerge {drc1 ant1 bump1 lvs1 dmv dodpo} }
create_links { {pnr dmv} rcxt }
create_links { {syn pnr} lec4 }
create_links { {pnr rcxt} {sta staf} }
create_links { {pnr rcxt} emir }
create_links { {ipmerge dmv dodpo} dmmerge }
create_links { dmmerge {drc2 ant2 bump2 lvs2} }
create_links { pnr lvs1 lvs2 }
# setup soc
set_tasks soc \
    --type fmtask \
    --flow soc_prometheus \
```

```
    --inputs        {
        hdl_designs AloePlatform
        hdl_insts   AloePlatform
        hdl_files   AloePlatform.v
    }
# setup mbist
set_tasks mbist \
    --type fmtask \
    --flow mbist_tessent
# setup syn
set_tasks syn \
    --type fmtask \
    --flow syn_dc \
    --configs       {
        chip_flow 1
    }
# setup scan_dc
set_tasks scan \
    --type fmtask \
    --flow scan_dc \
    --configs       {
     do_bscan 1
        chip_flow 1
        init_all_regs 1
    }
# setup atpg_tmax
set_tasks atpg \
    --type fmtask \
    --flow atpg_tmax \
    --configs       {
     compressed_mode {0 1}
     pll_bypass {0 1}
    }
# setup post-layout atpg_tmax
set_tasks atpg2 \
    --type fmtask \
    --flow atpg_tmax \
    --configs       {
     compressed_mode {0 1}
     pll_bypass {0 1}
    }
# setup lec1 (rtl vs mbist)
set_tasks lec1 \
    --type fmtask \
    --flow lec_fm \
    --inputs        {
     hdl {
```

```
            {{$SETUP(hdl)}}
            {{../mbist/output/$SETUP(design).mbist_rtl/*.v}}
        }
    } \
    --configs       {
        compare_mode            rtl_vs_rtl
        apply_func_mode_constants 1
    }
# setup lec2 (mbist vs syn)
set_tasks lec2 \
    --type fmtask \
    --flow lec_fm \
    --configs       {
        compare_mode rtl_vs_netlist
        apply_isolation_disable_constants 1
        apply_cutpoints 1
    }
# setup lec3 (syn vs scan)
set_tasks lec3 \
    --type fmtask \
    --flow lec_fm \
    --inputs        {
     svf ../scan/output/$SETUP(design)_scan.svf
    } \
    --configs       {
        apply_func_mode_constants 1
     force_svf_read              1
    }
# setup lec4 (scan vs pnr)
set_tasks lec4 \
    --type fmtask \
    --flow lec_fm \
    --configs       {
        apply_func_mode_constants 1
    }
# setup dfts_vcs
set_tasks dfts \
    --type fmtask \
    --flow dfts_vcs
# setup dfts_vcs
set_tasks dfts2 \
    --type fmtask \
    --flow dfts_vcs \
    --configs       {
        unit_delay_sim 0
    }
# setup pnr
```

```
set_tasks pnr \
    --type fmtask \
    --flow pnr_icc \
    --configs      {
        chip_flow 1
     pad       1
        bump      1
        rdl       1
    }
# setup ipmerge
set_tasks ipmerge \
    --type fmtask \
    --flow ipmerge_calibredrv
# setup rcxt
set_tasks rcxt \
    --type fmtask \
    --flow rcxt_starrc \
    --configs {
        power_nets {VDD VSS}
    }
# setup sta
set_tasks sta \
    --type fmtask \
    --flow sta_pts \
    --configs {
        num_process  16
        num_cpu      2
    }
# setup staf
set_tasks staf \
    --type fmtask \
    --flow sta_pts \
    --configs {
        num_process  16
        num_cpu      2
        sta_flat     1
    }
# setup emir
set_tasks emir \
    --type fmtask \
    --flow emir_pr
# setup lvs1 (pre dummy fill)
set_tasks lvs1 \
    --type fmtask \
    --flow lvs_calibre \
    --configs {
        uncomments {
```

```
            {#define HPC_PROCESS}
        }
    }
# setup drc1 (pre dummy fill)
set_tasks drc1 \
    --type fmtask \
    --flow drc_calibre \
    --configs {
        num_cpu 16
        comments   {
            {#DEFINE WITH_SEALRING}
            {#DEFINE CHECK_LOW_DENSITY}
        }
        uncomments {
            {#DEFINE UseprBoundary}
            {#DEFINE FULL_CHIP}
            {#DEFINE N28_HPC }
        }
    }
# setup ant1 (pre dummy fill)
set_tasks ant1 \
    --type fmtask \
    --flow drc_calibre \
    --inputs {
        deck ${pdk(calibre_ant)}
    }
# setup bump1 (pre dummy fill)
set_tasks bump1 \
    --type fmtask \
    --flow drc_calibre \
    --configs {
        comments   {
            {#DEFINE  BUMP_PITCH_167um_178um}
        }
        uncomments {
            {#DEFINE  BUMP_PITCH_178um_200um}
            {#DEFINE ChipWindowUsed}
        }
        replacement_patterns {
            {{VARIABLE xRT   1000.0} {VARIABLE xRT    7106.78}}
            {{VARIABLE yRT   1000.0} {VARIABLE yRT    5350}}
        }
    } \
    --inputs {
        deck ${pdk(calibre_bump)}
    }
# setup dodpo
```

```
set_tasks dodpo \
    --type fmtask \
    --flow dodpo_calibre \
    --configs {
        gdsout        1
        uncomments {
            {#DEFINE UseprBoundary}
        }
    }
# setup dmv
set_tasks dmv \
    --type fmtask \
    --flow dmv_calibre \
    --configs {
        gdsout        1
        uncomments {
            {#DEFINE UseprBoundary}
                    {#DEFINE 2K_THICK_M7}
                    {#DEFINE 2K_THICK_M8}
                    {#DEFINE 9K_THICK_M9}
                    {#DEFINE 9K_THICK_M10}
                    {#DEFINE FILL_DM9}
                    {#DEFINE FILL_DM10}
        }
    }
# setup dmmerge
set_tasks dmmerge \
    --type fmtask \
    --flow dmmerge_calibredrv
# setup lvs2 (post dummy fill)
set_tasks lvs2 \
    --type fmtask \
    --flow lvs_calibre \
    --configs {
        uncomments    {
            {#define HPC_PROCESS}
        }
    }
# setup drc2 (post dummy fill)
set_tasks drc2 \
    --type fmtask \
    --flow drc_calibre \
    --configs {
        num_cpu 16
        comments    {
            {#DEFINE WITH_SEALRING}
        }
```

```
            uncomments {
                {#DEFINE UseprBoundary}
                {#DEFINE N28_HPC }
                {#DEFINE FULL_CHIP}
            }
        }
# setup ant2 (post dummy fill)
set_tasks ant2 \
    --type fmtask \
    --flow drc_calibre \
    --inputs {
        deck ${pdk(calibre_ant)}
    }
# setup bump2 (post dummy fill)
set_tasks bump2 \
    --type fmtask \
    --flow drc_calibre \
    --configs {
        comments    {
            {#DEFINE  BUMP_PITCH_167um_178um}
        }
        uncomments {
            {#DEFINE  BUMP_PITCH_178um_200um}
            {#DEFINE ChipWindowUsed}
        }
        replacement_patterns {
            {{VARIABLE xRT   1000.0} {VARIABLE xRT    7106.78}}
            {{VARIABLE yRT   1000.0} {VARIABLE yRT    5350}}
        }
    } \
    --inputs {
        deck ${pdk(calibre_bump)}
    }
# fmtask tags setup
set_tasks [get_tasks .* --type fmtask] \
    --fmtask_tags SETUP
#----------------------------------------------------------------
-----------------------------------------
# Automatic flow variables
#----------------------------------------------------------------
-----------------------------------------
# whether or not flow has mbist
if { {mbist_tessent} in [get_flows_of_tasks] } {
    set_fmtask_tag SETUP \
        --key has_mbist \
        --value 1
} else {
```

```
    set_fmtask_tag SETUP \
        --key has_mbist \
        --value 0
}
# whether or not flow has scan
if { {scan_dc} in [get_flows_of_tasks] } {
    set_fmtask_tag SETUP \
        --key has_scan \
        --value 1
} else {
    set_fmtask_tag SETUP \
        --key has_scan \
        --value 0
}
#------------------------------------------------------------------
------------------------------------------
# Write flow
#------------------------------------------------------------------
------------------------------------------
# wrap up flow
wrap_flow $SETUP(design)
# write flow
write_flow $SETUP(design) \
    --directory ../$SETUP(design)
# write flowgraph
if { [info exists BROWSER] && $BROWSER } {
    set option "--browser "
} else {
    set option ""
}
eval proc_gen_flow_graph $SETUP(design) \
    --directory flowgraph \
    $option
# exit
if { $EXIT } {
    exit
}
```

What is claimed is:

1. A method comprising:
accessing a design flow configuration data structure, wherein the design flow configuration data structure is encoded in a tool control language;
based on the design flow configuration data structure, selecting multiple flowmodules from a set of flowmodules, wherein each flowmodule in the set of flowmodules provides an application programming interface, in the tool control language, to a respective electronic design automation tool;
based on the design flow configuration data structure, generating a design flow as a directed acyclic graph including the selected flowmodules as vertices;
generating an output integrated circuit design data structure, based on one or more input integrated circuit design data structures, using the design flow to control the respective electronic design automation tools of the selected flowmodules; and
transmitting, storing, or displaying the output integrated circuit design data structure.

2. The method of claim 1, in which generating the design flow comprises:
generating, based on the design flow configuration data structure, a first design flow;
generating a current integrated circuit design data structure, based on one or more input integrated circuit design data structures, using the first design flow;
determining one or more parameters of the current integrated circuit design data structure;
inputting the one or more parameters to a machine learning module to obtain one or more feedback parameters as output of the machine learning module; and
generating, based on the one or more feedback parameters, a next design flow.

3. The method of claim 2, wherein the one or more parameters of the current integrated circuit design data structure include estimates of power, performance, and area for an integrated circuit described by the current integrated circuit design data structure.

4. The method of claim 1, comprising:
generating a graphical representation of the directed acyclic graph of the design flow; and
transmitting, storing, or displaying the graphical representation.

5. The method of claim 1, wherein the design flow includes a vertex corresponding to a task for hypertext markup language generation, comprising:
generating a hypertext markup language data structure, based on the output integrated circuit design data structure, using the design flow; and
transmitting, storing, or displaying the hypertext markup language data structure.

6. The method of claim 1, wherein the design flow is encoded as a make file.

7. The method of claim 1, wherein the design flow is encoded as a make++ file.

8. The method of claim 1, wherein the output integrated circuit design data structure includes a physical design data structure for an integrated circuit.

9. The method of claim 1, wherein the output integrated circuit design data structure includes a GDSII file for an integrated circuit.

10. The method of claim 1, wherein a respective electronic design automation tool of one of the selected flowmodules is a source synthesis tool, a respective electronic design automation tool of one of the selected flowmodules is a place and route tool, and a respective electronic design automation tool of one of the selected flowmodules is a static timing analysis tool.

11. The method of claim 1, wherein the one or more input integrated circuit design data structures include a register-transfer level data structure.

12. The method of claim 1, wherein the design flow configuration data structure is part of a design parameters data structure, comprising:
accessing the design parameters data structure, wherein the design parameters data structure includes values of design parameters of an integrated circuit design;
responsive to a command identifying the design parameters data structure, generating a register-transfer level data structure for an integrated circuit based on the design parameters data structure;
responsive to the command identifying the design parameters data structure, generating a software development kit for the integrated circuit based on the register-transfer level data structure;
wherein the multiple flowmodules are selected responsive to the command identifying the design parameters data structure;
wherein the design flow is generated responsive to the command identifying the design parameters data structure;
wherein the output integrated circuit design data structure includes a physical design data structure for the integrated circuit that is generated, responsive to the command identifying the design parameters data structure, based on the register-transfer level data structure.
responsive to the command identifying the design parameters data structure, generating a test plan for an integrated circuit based on the design parameters data structure and acceptance criteria;
responsive to the command identifying the design parameters data structure, invoking tests for the integrated circuit based on the test plan, the register-transfer level data structure, the software development kit, and the physical design data structure to obtain a set of test results; and
transmitting, storing, or displaying a design data structure based on the register-transfer level data structure, the software development kit, the physical design data structure, and the test results.

13. The method of claim 12, comprising:
transmitting a physical design specification based on the physical design data structure to a server to invoke manufacturing of the integrated circuit.

14. The method of claim 13, comprising:
manufacturing the integrated circuit;
installing the integrated circuit in a system configured to operate the integrated circuit responsive to commands received via communications with a cloud server; and
transmitting a login for accessing and controlling the integrated circuit.

15. A system comprising:
a network interface;
a memory; and
a processor, wherein the memory includes instructions executable by the processor to cause the system to:
access a design flow configuration data structure, wherein the design flow configuration data structure is encoded in a tool control language;
based on the design flow configuration data structure, select multiple flowmodules from a set of flowmodules, wherein each flowmodule in the set of flowmodules provides an application programming interface, in the tool control language, to a respective electronic design automation tool;

based on the design flow configuration data structure, generate a design flow as a directed acyclic graph including the selected flowmodules as vertices; and generate an output integrated circuit design data structure, based on one or more input integrated circuit design data structures, using the design flow to control the respective electronic design automation tools of the selected flowmodules.

16. The system of claim 15, wherein the memory includes instructions executable by the processor to cause the system to:

generate, based on the design flow configuration data structure, a first design flow;

generate a current integrated circuit design data structure, based on one or more input integrated circuit design data structures, using the first design flow;

determine one or more parameters of the current integrated circuit design data structure;

input the one or more parameters to a machine learning module to obtain one or more feedback parameters as output of the machine learning module; and generate, based on the one or more feedback parameters, a next design flow.

17. The system of claim 16, wherein the one or more parameters of the current integrated circuit design data structure include estimates of power, performance, and area for an integrated circuit described by the current integrated circuit design data structure.

18. The system of claim 15, wherein the memory includes instructions executable by the processor to cause the system to:

generate a graphical representation of the directed acyclic graph of the design flow; and transmit, store, or display the graphical representation.

19. The system of claim 15, wherein the design flow is encoded as a make file.

20. The system of claim 15, wherein the design flow is encoded as a make++ file.

21. The system of claim 15, wherein the output integrated circuit design data structure includes a physical design data structure for an integrated circuit.

22. The system of claim 15, wherein the output integrated circuit design data structure includes a GDSII file for an integrated circuit.

23. The system of claim 15, wherein a respective electronic design automation tool of one of the selected flowmodules is a source synthesis tool, a respective electronic design automation tool of one of the selected flowmodules is a place and route tool, and a respective electronic design automation tool of one of the selected flowmodules is a static timing analysis tool.

24. The system of claim 15, wherein the one or more input integrated circuit design data structures include a register-transfer level data structure.

25. The system of claim 15, wherein the design flow configuration data structure is part of a design parameters data structure, and the memory includes instructions executable by the processor to cause the system to:

access the design parameters data structure, wherein the design parameters data structure includes values of design parameters of an integrated circuit design;

responsive to a command identifying the design parameters data structure, generate a register-transfer level data structure for an integrated circuit based on the design parameters data structure;

responsive to the command identifying the design parameters data structure, generate a software development kit for the integrated circuit based on the register-transfer level data structure;

wherein the multiple flowmodules are selected responsive to the command identifying the design parameters data structure;

wherein the design flow is generated responsive to the command identifying the design parameters data structure;

wherein the output integrated circuit design data structure includes a physical design data structure for the integrated circuit that is generated, responsive to the command identifying the design parameters data structure, based on the register-transfer level data structure.

responsive to the command identifying the design parameters data structure, generate a test plan for an integrated circuit based on the design parameters data structure and acceptance criteria; and responsive to the command identifying the design parameters data structure, invoke tests for the integrated circuit based on the test plan, the register-transfer level data structure, the software development kit, and the physical design data structure to obtain a set of test results.

26. The system of claim 25, wherein the memory includes instructions executable by the processor to cause the system to:

transmit a physical design specification based on the physical design data structure to a server to invoke manufacturing of the integrated circuit.

27. A non-transitory computer-readable storage medium that includes instructions that, when executed by a processor, facilitate performance of operations comprising:

accessing a design flow configuration data structure, wherein the design flow configuration data structure is encoded in a tool control language;

based on the design flow configuration data structure, selecting multiple flowmodules from a set of flowmodules, wherein each flowmodule in the set of flowmodules provides an application programming interface, in the tool control language, to a respective electronic design automation tool;

based on the design flow configuration data structure, generating a design flow as a directed acyclic graph including the selected flowmodules as vertices;

generating an output integrated circuit design data structure, based on one or more input integrated circuit design data structures, using the design flow to control the respective electronic design automation tools of the selected flowmodules; and transmitting, storing, or displaying the output integrated circuit design data structure.

* * * * *